United States Patent
Hennig et al.

(10) Patent No.: US 10,770,508 B2
(45) Date of Patent: Sep. 8, 2020

(54) ACTUATOR DEVICE

(71) Applicant: PI Ceramic GmbH, Lederhose (DE)

(72) Inventors: Eberhard Hennig, Mörsdorf (DE);
Peter Ditas, Münchenbernsdorf (DE);
Frank Grünwald, Graitschen (DE)

(73) Assignee: Pi Ceramic GmbH, Lederhose (DE)

( * ) Notice: Subject to any disclaimer, the term of this patent is extended or adjusted under 35 U.S.C. 154(b) by 616 days.

(21) Appl. No.: 15/532,040

(22) PCT Filed: Nov. 30, 2015

(86) PCT No.: PCT/EP2015/002406
§ 371 (c)(1),
(2) Date: Oct. 10, 2017

(87) PCT Pub. No.: WO2016/087036
PCT Pub. Date: Jun. 9, 2016

(65) Prior Publication Data
US 2018/0061885 A1 Mar. 1, 2018

(30) Foreign Application Priority Data

Dec. 1, 2014 (DE) .................. 10 2014 017 746
Dec. 1, 2014 (DE) .................. 20 2014 009 536

(51) Int. Cl.
*H01L 41/04* (2006.01)
*H01L 27/20* (2006.01)
(Continued)

(52) U.S. Cl.
CPC .......... *H01L 27/20* (2013.01); *B41J 2/14201* (2013.01); *H01L 41/0475* (2013.01);
(Continued)

(58) Field of Classification Search
CPC .................. B41J 2/14201; H01L 41/0475
See application file for complete search history.

(56) References Cited

U.S. PATENT DOCUMENTS 5,144,342 A    9/1992   Kubota
5,945,773 A * 8/1999   Nagashima .......... B41J 2/14274
                                                                              310/328
(Continued)

FOREIGN PATENT DOCUMENTS

DE   102012023521 A1   1/2014
EP        1382600 B1    5/2005
(Continued)

OTHER PUBLICATIONS

International Search Report, PCT/EP2015/002406, dated Mar. 24, 2016, 2 pages (in English).
(Continued)

*Primary Examiner* — J. San Martin
(74) *Attorney, Agent, or Firm* — The Juhasz Law Firm

(57) ABSTRACT

An actuator device (AV) including a main body (10) with a base body (10a) and a buildup body (10b) a plurality of actuators which are formed of actuator bodies comprising a piezoelectric or electrostrictive material and actuation electrodes and a printed circuit board (100) which extends in the longitudinal direction (X) of the actuator device (AV) over at least sections of actuator connection coatings, wherein conductive paths thereof are in electrical contact with the actuator connection coatings and wherein in the connection area segment (S0*b*, S1*b*, S2*b*, S3*b*) of the respective recess (S0, S1, S2, S3) at least in sections a connection layer (V) made of a resin reinforcement material with bismaleimide is disposed such that the connection layer (V) at least in sections contacts side surfaces (AS1, AS2) which respectively delimit a connection area segment (S0*b*, S1*b*, S2*b*, S3*b*) and which are opposed to each other.

13 Claims, 14 Drawing Sheets

(51) Int. Cl.
*H01L 41/047* (2006.01)
*H01L 41/29* (2013.01)
*B41J 2/14* (2006.01)
*H01L 41/22* (2013.01)
*H01L 41/083* (2006.01)

(52) U.S. Cl.
CPC .............. *H01L 41/22* (2013.01); *H01L 41/29* (2013.01); *H01L 41/083* (2013.01)

(56) References Cited

U.S. PATENT DOCUMENTS

| | | | |
|---|---|---|---|
| 6,769,158 B2 * | 8/2004 | Gutierrez | B41J 2/1612 29/25.35 |
| 9,748,468 B2 * | 8/2017 | Hennig | B06B 1/0622 |
| 2003/0020371 A1 * | 1/2003 | Nakatani | H01L 41/083 310/328 |
| 2004/0227432 A1 | 11/2004 | Takahashi | |
| 2010/0245490 A1 | 9/2010 | Tsukamura et al. | |
| 2015/0236239 A1 | 8/2015 | Eberhard et al. | |
| 2016/0023461 A1 * | 1/2016 | Chen | B41J 2/1623 347/50 |

FOREIGN PATENT DOCUMENTS

| | | |
|---|---|---|
| EP | 1582574 A1 | 10/2005 |
| EP | 1582574 B1 | 12/2006 |
| EP | 1770798 A1 | 4/2007 |
| JP | 2012-074938 A | 4/2012 |
| WO | 2008055867 A1 | 5/2008 |

OTHER PUBLICATIONS

Written Opinion, PCT/EP2015/002406, dated Jun. 23, 2015, 6 pages.
Office Action and Translation for related case, EP15823590.3, dated Feb. 2, 2017, including translation and reference cited in Office Action (10 pages).
International Preliminary Report on Patentability, PCT/EP2015/002406, dated Jun. 6, 2017, 7 pages (in English).
Written Opinion, PCT/EP2015/002406, dated Mar. 24, 2016, 10 pages.
Bismaleimides, Bisaleimide Adhesives Technology, from Polymerics GmbH, document XP055344515, updated Aug. 1, 2002 (2 pages).
Office Action, EP Appl. 15823590.3-1556, dated Feb. 20, 2017 (4 pages).

* cited by examiner

ACTUATOR DEVICE

RELATED APPLICATIONS

This application claims priority, under the terms of 35 U.S.C. § 371(c), to PCT/EP2015/002406, filed Nov. 30, 2015, which is hereby incorporated by reference in its entirety; PCT/EP2015/002406 claims priority to two German national applications: DE 102014017746.7, filed Dec. 1, 2014, and DE 2020140009536.1, also filed on Dec. 1, 2014, which are incorporated by reference in their entirety.

BACKGROUND OF THE APPLICATION

1. Field of the Invention

The present application concerns an actuator device.

DESCRIPTION OF THE RELATED ART

From U.S. Pat. No. 5,144,342, and from U.S. Pat. Appl Publ. 2010/245490A1 and U.S. Pat. Appl. Publ. 2004/227432A1 respectively, an actuator device with actuators made of a piezoelectric material is known. The object of the present disclosure is to provide an actuator device with actuators are made of a piezoelectric material and with a printed circuit board which particularly is flexible and which is electrically connected to the actuators, wherein the actuator device can be manufactured effectively and provides a high functional safety.

SUMMARY OF THE INVENTION

This object is solved by the features of claim 1. Further embodiments are described in the dependent claims which respectively refer to claim 1.

According to the one embodiment of the disclosure, an actuator device is provided, the actuator device includes a main body with a base body and buildup body which extends from the base body in a thickness direction; a plurality of actuators forming the buildup body, wherein each of the actuators extend in a depth direction and is formed of an actuator body which is made of a piezoelectric or electrostrictive material and comprises actuation electrodes which are disposed at or in the actuator and which are distanced from each other, wherein the actuators are arranged behind each other in the longitudinal direction of the actuator device, wherein a actuation area segment of a recess is formed between each of two neighboring actuators. In this embodiment, the actuators include electroconductive actuator connection coatings which are electrically connected to the actuation electrodes of the actuators, wherein the actuator connection coatings at least in sections are disposed (i) either on a surface of the base body which is oriented in the thickness direction; (ii) or on an actuator step section of the actuators, wherein the actuator step section joins in depth direction a respective actuator body of the actuators.

In this embodiment, between actuator connection coatings of respective two neighboring actuators, a respective one connection area segment of a respective recess is disposed a printed circuit board which extends in the longitudinal direction of the actuator device over at least sections of the actuator connection coatings, wherein the conductive paths of the printed circuit board are in electrical contact with the actuator connection coatings wherein in the connection area segment of the respective recess at least in sections a connection layer is disposed which is made of a resin reinforcement material, wherein the connection layer at least in sections contacts side surfaces which delimit a respective connection area segment and which are opposed to each other, the surface section of the base body which is oriented in the thickness direction, the area of the printed circuit board which faces the surface section of the base body, in order to support the printed circuit board in the area of the respective connection area segments of a respective recess and to fix the printed circuit board to the actuator connection coatings.

With the actuator device of the present disclosure comprising the resin reinforcement material, hereinafter referred to as reinforcement material, the particularly flexible printed circuit board connected to the actuators is both electrically and mechanically stable. With this solution, and with the actuator device comprising the connection layer made from a cured resin reinforcement material, it is possible to manufacture the actuator device with a low scrap rate.

After filling the recesses respectively between two neighboring actuators and when the reinforcement material is still in a viscous state, the particularly flexible printed circuit board is disposed and positioned on step sections of the actuators to that, when a minimum amount of the reinforcement material in the respective recesses, the reinforcement material reliably attains connection contact with the side surfaces of the step sections of the actuators which are lying at the respective recess, the side surfaces being opposed to each other, the recess surface and lower side of the printed circuit board which faces the recess surface.

After curing the reinforcement material the same forms a support part which supports the particularly flexible printed circuit board in the area of the connection area segments of a respective recess, and simultaneously provides a fixation of the printed circuit board at the actuator connection coating. By applying the reinforcement material according to the disclosure it is achieved that after bringing in the reinforcement material in a non-hardened state and after pressing the particularly flexible printed circuit board onto the actuator extensions or actuator step sections sufficiently thin glue joints are generated between the particularly flexible printed circuit board and the actuator step sections by which a safe galvanic connection between the metallization of the printed circuit board and the actuator connection coatings is ensured.

The resin reinforcement material can particularly be an epoxy resin. The resin reinforcement material can also comprise bismaleimide. Under "bismaleimide," a substance according to CAS-Nr. 13676-54-5 is intended. Thereby the resin reinforcement material can be a mixture of epoxy resin and bismaleimide. Particularly provision can be made that the resin reinforcement material is produced by adding powdery bismaleimide to epoxy resin.

Bismaleimide has the advantage compared to other resin materials as for example epoxide that it has an essentially better temperature stability or a constancy of mechanical properties and/or chemical properties over a large temperature range. Hence, the support function or the fixation function of the reinforcement material is maintained or ensured over a large temperature range or up to relatively high temperatures.

By the proportion of bismaleimide in the reinforcement material, also by the use of bismaleimide resin, a cross-linking in the resin is achieved essentially by a polyaddition reaction, wherein the curing takes place after the addition of the reinforcement material in the respective recesses and upon an activation by reaching of an appropriate increase of temperature of the reinforcement material, whereby—with regard to a resin reinforcement material without bismaleimide—during curing the cross-linking occurs without the generation of undesired by-products.

In the embodiment of the actuator device according to the disclosure in which the resin reinforcement material comprises bismaleimide, the reinforcement material—with regard to a conventional resin reinforcement material without bismaleimide—has a smaller shrinkage during curing and a smaller thermal expansion coefficient so that the resistance of the connection of the printed circuit board with the main body and the actuators against fracture propagation and rupture is increased in the area of the reinforcement material. Thereby the circuit board can be designed very thin and particularly flexible.

Further by the use of reinforcement material with bismaleimide an advantageous moisture resistance is achieved. As further advantage the reinforcement material with bismaleimide has a modulus of elasticity which changes relatively little over the temperature progression so that during operation the actuator device according to the disclosure complies with a predefined behaviour in a reliable manner also in case of major temperature fluctuations.

According to the disclosure advantages of bismaleimide resins are taken into account, as for example:

high curing temperatures and long curing times
high brittleness of un-modified bismaleimide resins.

When using a corresponding amount of resin reinforcement material and by placing the printed circuit board on the extension sublayer, the resin reinforcement material flows additionally between the respective extension sublayers and the printed circuit board for fixation of the printed circuit board at the extension sublayer, wherein the part of the reinforcement material which lies between the same is joined with the part of the reinforcement material which lies in the connection area segment of the respective recess which delimits the extension sublayer.

After placing the printed circuit board on the actuator connection coatings the resin reinforcement material is activated and thereby the cross-linking of the molecules is achieved particularly by polyaddition.

By a temperature-time profile during activation and during curing, respectively, which is appropriately selected it is achieved with high reliability that within the respective recess the bismaleimide resin contacts the surfaces which form the recess in order to establish the support function of the reinforcement material and that, at the same time, a safe galvanic connection between the metallization of the printed circuit board and the actuator connection coatings is provided.

According to an embodiment of the actuator device the resin reinforcement material contains bismaleimide with a portion between 5 and 20 percent by weight of the reinforcement material.

According to an embodiment of the actuator device the resin reinforcement material contains bismaleimide with a minimum portion of 20 percent by weight of the reinforcement material. In this regard the bismaleimide can consist of 1,1'-(methylenedi-p-phenylene)bismaleimide or can be formed of 1,1'-(methylenedi-p-phenylene)bismaleimide. According to an embodiment of the actuator device the resin reinforcement material contains an acrylate with a portion between 0.1 percent by weight and 30 percent by weight of the reinforcement material. Thereby the viscosity of the resin reinforcement material is decreased at room temperature and thereby a better processability of the resin reinforcement material at room temperature is achieved.

In this regard the acrylate can consist of ore can be made of triethylene-glycol-dimethacrylate. Particularly the acrylate can be a substance with CAS number 109-16-0. By applying acrylate in the reinforcement material the adhesion property of the reinforcement material and thereby the fixation of the printed circuit board on the actuators is improved.

According to an embodiment of the actuator device the resin reinforcement material comprises acrylate with a portion between 0.1 percent by weight and 20 percent by weight and bismaleimide with a portion between 1 percent by weight and 80 percent by weight.

According to an embodiment of the actuator device resin reinforcement material contains a phenolic resin with a portion between 0.1 percent by weight and 40 percent by weight.

According to an embodiment of the actuator device the resin reinforcement material contains a phenolic resin with a portion of at least 0.1 percent by weight to 40 percent by weight, an acrylate between 0.1 percent by weight and 30 percent by weight and bismaleimide with a portion between 0.1 percent by weight and 30 percent by weight.

The phenolic resin consists of 4,4'-(1-methylethylidene)bis[2-(2-propenyl)phenol] or is formed of 4,4'-(1-methylethylidene)bis[2-(2-propenyl)phenol)]. Particularly the phenolic resin can be a substance with CAS number 1745-89-7.

According to an embodiment of the actuator device the resin reinforcement material with bismaleimide is produced by adding powdery bismaleimide to epoxy resin.

According to an embodiment of the actuator device the resin reinforcement material is lies or is disposed additionally between the extension sublayer and the printed circuit board for fixation of the printed circuit board at the extension sublayer, wherein the part of the resin reinforcement material which lies between the same is joined with the part of the resin reinforcement material which lies in the connection area segment of the respective recess.

According to a further embodiment of the actuator device provision is made that electroconductive front side coatings are disposed at the surfaces of the actuators which are facing the front side and which are in electrical contact with the actuator connection coatings, wherein the front side coatings are electrically connected to the actuation electrodes of the actuators.

According to a further embodiment of the actuator device provision is made that at the rear side of the actuator device an electroconductive rear side coating is disposed which is in electrical contact with the actuation electrodes of the actuators.

According to a further embodiment of the actuator device according to the disclosure provision is made that the actuators respectively comprise at least two inner actuation electrodes which extend in positive depth direction from the front side to a distance to the surface at the rear side, and that the actuators respectively comprise at least two common inner electrodes which extend in negative depth direction from the rear side to a distance to the surface at the front side, wherein the actuation electrodes are electrically connected to the front side coatings and the common inner electrodes are electrically connected to the rear side coating.

According to a further aspect of the disclosure a method for manufacturing of an embodiment of the actuator device according to the disclosure is provided, wherein the method comprises the following steps:

arrangement of the resin reinforcement material in the at least one connection area segment in a not yet activated state, placing the printed circuit board on the actuator connection coatings, wherein an amount of resin reinforcement material is disposed in the respective connection area segment such that the resin reinforcement material contacts the surfaces which delimit the respective connection area segment, and activation of the resin reinforcement material by heating the same for cross-linking the resin reinforcement material.

Generally under the expression "surface oriented in a direction," as for example "surface which is oriented in the X-direction," it is understood that the surface normal direction of the respective surface is oriented in the said direction, as for example in the X-direction, or in an acute angle, in an angle of maximum 45 degrees in relation to the same.

Under "coating" herein—so far no other determination is made—generally a coating with an electroconductive layer is understood.

BRIEF DESCRIPTION OF THE DRAWINGS

In the following embodiments of the disclosure are described with reference to the accompanying figures, the figures showing:

FIG. 12 depicts a schematic perspective presentation of the further embodiment of the actuator device according to the disclosure according to the presentation of FIG. 11, wherein FIG. 12 is based on a viewing direction on a rear side of the actuator device;

In the figures components and parts with similar or equal function are partially provided respectively with the same reference numerals.

DETAILED DESCRIPTION OF THE DISCLOSURE

Figure 1:
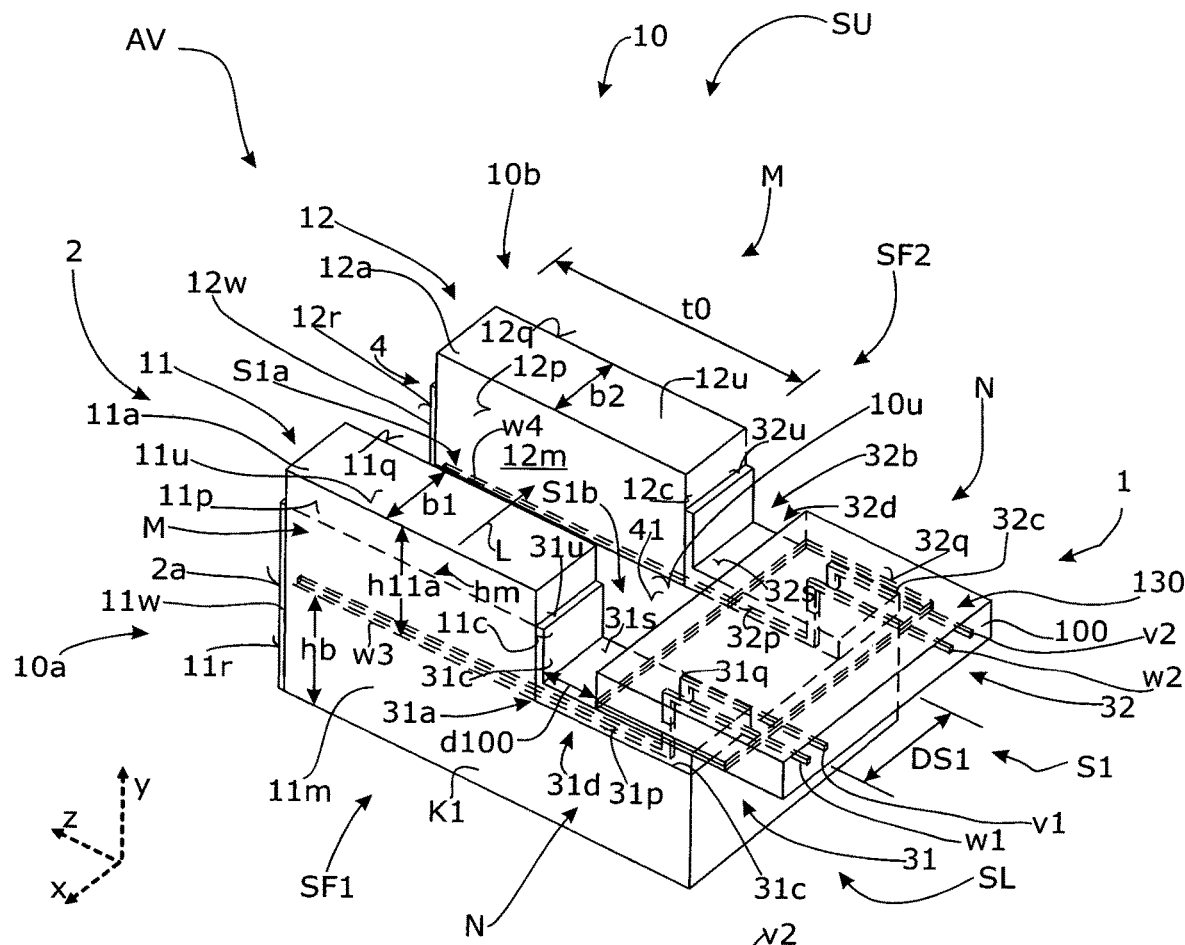
FIG. 1 depicts a perspective presentation of an embodiment of the actuator device according to the disclosure as a view based on a viewing direction on a front side of the same, wherein the actuator device comprises: a main body which comprises a base body and a buildup body with two actuators which respectively comprises an actuator body, outer electrodes and a actuator connection coating, as well as a printed circuit board.

The actuator device AV according to the disclosure comprises a plurality of actuator devices, each having at least two actuators which are formed of a piezoelectric or electrostrictive material and which comprises actuation electrodes which are spaced from each other. An actuator device AV according to the disclosure can also comprise a plurality of actuators, which number amounts between 100 and 500. With the embodiments of the actuator device AV shown in FIGS. 1 to 10, the actuator device AV respectively comprises two actuators 11, 12.

In FIGS. 11 to 20, embodiments of the actuator device AV are shown which respectively are formed of more than two actuators which are formed of a piezoelectric or electrostrictive material and of actuation electrodes which are distanced from each other, wherein for better understanding in the figures mostly three actuators 11, 12, 13 are shown and correspondingly described. As the actuators of the group of embodiments of the actuator device AV of FIGS. 1 to 10 have generally the same function as the actuators of the group of the embodiments of the embodiments of the actuator device AV shown in FIGS. 11 to 20, for both groups of embodiments, the same reference numerals are used. Thereby, in the following with the use of the reference numerals for the three actuators 11, 12, 13 shown in the FIGS. 11 to 20 and the reference numerals for components of the same, both groups of embodiments of the actuator device AV are intended.

The piezoelectric or electrostrictive material of the actuators 11, 12, 13 of the actuator device AV according to the disclosure is activated by actuation electrodes by actuator connection coatings 31$d$, 32$d$, 33$d$ which are electrically connected to the same. The actuation electrodes generally lie in an arrangement in or at the actuators 11, 12, 13 in which sections of the actuation electrodes lie in a minimum distance to each other, wherein between sections which are lying in a distance to each other piezoelectric or electrostrictive material is lying so that, in case that voltage is applied between these sections, piezoelectric or electrostrictive effects of the piezoelectric or electrostrictive material can be generated.

In this regard the actuators 11, 12, 13 can individually be electrically actuated by means of an electric excitation device which is not shown in the figures, wherein the actuation electrodes of the actuators 11, 12, 13 are connected over a particularly flexible printed circuit board which is schematically shown in the figures and which is assigned the reference numeral "100" in the same. The actuation electrodes can be designed in different manners at or in the actuators 11, 12, 13 and—as described in the following—can be formed from inner actuation electrodes, outer actuation electrodes or both.

For describing the actuator device AV according to the disclosure in the figures, an orthogonal coordinate system with a X-direction is inserted which extends contrary to the longitudinal direction L of the actuator device AV according to the disclosure. The actuators 11, 12, 13 are disposed next to each other when viewed in the longitudinal direction L of the actuator device according to the disclosure. The Y-direction means a thickness direction or height direction of the actuator device according to the disclosure and the Z-direction means a depth direction or width direction of the actuator device AV according to the disclosure.

The embodiments of the actuator device AV generally respectively comprise an actuator device main body 10, or briefly main body 10, which forms a base body 10$a$ and a buildup body 10$b$, wherein the buildup body 10$b$ comprises the actuators 11, 12, 13 with an actuator connection coating 31$d$, 32$d$, 33$d$ which are electrically connected to the electric excitation device and with at least one of the at least two actuation electrodes of the electric excitation device. The actuators 11, 12, 13 can respectively comprise an actuator step section 11$n$, 12$n$, 13$n$, wherein in this case an actuator connection coating 31$d$, 32$d$, 33$d$ lies on a respective one actuator step section 11$n$, 12$n$, 13$n$. Further, the actuator device AV can comprise a rear side layer 4 which is disposed at a rear side 2, wherein the same comprises a rearside outer layer as outer actuation electrode which is disposed at the rear side 2 of the actuator device AV, wherein the actuators 11, 12, 13 comprise the rear side partial layers 11$z$, 12$z$ which form the rear side layer 4 (for example FIG. 1). As an example the rear side layer 4 or the rear side partial layers 11$z$, 12$z$ can be connected to the electric excitation device over the printed circuit board 100 or over a return body and thereby optionally over the printed circuit board 100. In this manner with a corresponding control by the electrical excitation device, a polarity can be achieved which is contrary to each other at the rear side layer 4 or the rear side partial layers 11$z$, 12$z$.

The actuator device AV further comprises: a front side 1, the rear side 2 which lies opposite to the front side 1 in relation to a longitudinal direction X of the actuator device AV, a lower side SL which is oriented in the negative Y-direction and an upper side SU which is oriented in the positive Y-direction. The front side 1 is lying on a side which lies opposite the rear side 2, when viewed in the longitudinal direction or in the X-direction and in relation to the position of the actuators 11, 12, 13, so that the front side 1 is disposed beyond the rear side 2 in relation to the actuators 11, 12, 13. The rear side 2 of the main body 10 is formed of a surface 2$a$ which can form a uniform and particularly plane surface. In this context under "uniform," it is understood that the surface extends along the X-direction. Particularly in this regard provision can be made that the surface 2$a$ comprises a uniform curvature over its extension, thus does not has a turning point. Further the actuator device AV comprises front sides, for example 11$q$, 12$p$, which respectively lie opposed to each other when viewed in the X-direction.

In the shown embodiments of the actuator device according to the disclosure, the actuators 11, 12, 13 are disposed next to each other, when viewed in the Z-direction, and behind each other, when viewed contrary to the X-direction or in the X-direction. Thereby a recess S1 and S2, respectively, is formed between respective two actuators—for example between the actuators 11 and 12 or between the actuators 12 and 13, wherein the respective recess S1 and S2, respectively, has a width DS1 and DS2, respectively, which extends in the X-direction and which comprises surfaces 41 and 42, respectively, which are oriented in the Y-direction.

in case of the embodiments of the actuator device AV according to the FIGS. 1 to 10 with two actuators 11, 12, between the actuators 11 and 12 a recess S1 is formed, the same having a width DS1 which extends in the X-direction and comprising a surface 41 as part of the surface 10$u$ of the base body 10$a$, wherein the surface 41 is oriented in the Y-direction.

in case of the embodiments of the actuator device AV according to FIGS. 11 to 20, between respective two actuators—for example between the actuators 11 and 12 or between the actuators 12 and 13—respectively, one recess S1 and S2, respectively, is formed, the same having width DS1 and DS2, respectively, which extends in the X-direction and comprising surfaces 41 and 42, respectively, which are oriented in the Y-direction.

The respective recesses S1, S2 are delimited in the Z-direction and thus formed by surfaces 41 and 42, respectively, and sides 11$q$, 12$p$ and 12$q$, 13$q$ respectively, of neighboring actuators 11 and 12, or 12 and 13, respectively, wherein the sides face each other. In case of an actuator device AV with more than three actuators, the widths DS1, DS2 in the X-direction which are disposed between respectively neighboring actuators 11 and 12 or 12 and 13, respectively, can particularly be of equal size. Alternatively, also widths DS1, DS2 with different sizes can be provided.

The base body 10$a$ extends in the positive Y-direction to the surfaces 10$u$ and 41, 42, respectively, of the recesses S1 and S2, respectively, which join the sides 11$q$, 12$p$ and 12$q$, 13$q$ respectively, of neighboring actuators 11 and 12, or 12 and 13, respectively. The base body 10$a$ is formed of a substrate body K1 and, if applicable, comprises outer layers which are disposed thereto, as for example the rear side layer 4. The substrate body K1 reaches in Y-direction up to a height hb. At this position the actuator bodies 10$a$, 11$a$, 12$a$ extend in Y-direction from the substrate body K1.

In case of the embodiments of the actuator device of the disclosure according to FIGS. 1 to 10, the base body 10$a$ extends, when viewed in the positive Y-direction, to the surface 10$u$ of the recess S1 or, respectively, to the surfaces between the actuator bodies 11$a$, 12$a$, 13$a$, which are oriented in the Y-direction. In case of the embodiments of the actuator device of the disclosure according to FIGS. 11 to 20, the base body 10$a$ extends, when viewed in the positive Y-direction, to the surfaces 40, 41, 42 of the recesses S0, S1, S2. In FIGS. 11 to 20, as an example, the height hb of the base body 10$a$ is inserted.

With the embodiments of the actuator device AV, provision can particularly be made that the substrate body K1 is formed as block so that the substrate body K1 can be formed unitary from a base material. Thereby provision can also be made that the outer contour which is formed by the outer surfaces of the main body 10 has a rectangular block shape. The virtual upper side of the main body 10 is partially formed, in case of the embodiments according to FIGS. 1 to 10, by the surface 40 and, in case of the embodiments according to FIGS. 12 to 14, by the surfaces 40 and 41 and 42, respectively, as well as by the connecting surfaces which virtually extend within the actuators and which connect the same. The virtual connecting surfaces can particularly be defined such that the same comprise a curvature between the respective surfaces 40, 41, 42 of the surface 10$u$ over the complete connecting surface which is as low as possible. The actuator bodies 11$a$, 12$a$, 13$a$ are preferably connected to the substrate body K1 and particularly manufactured as one piece. In case that the actuator bodies 11$a$, 12$a$, 13$a$ are manufactured as separate parts with regard to the substrate body K1, the actuator bodies 11$a$, 12$a$, 13$a$ lie in their respective connecting area which connects the same to the substrate body K1 flat on the same and are permanently attached to the same so that neither the respective actuator 11, 12, 13 as whole nor a partial section of the respective actuator 11, 12, 13 has a freedom of movement with regard to the main body 10.

Generally, at rear side-surfaces 11$r$, 12$r$ of the actuators 11 and 12, respectively, rear side partial layers 11$w$, 12$w$ or connection layers can be disposed to which by the electrical excitation device a polarity is applied which is contrary to the polarity which is applied at the one outer or inner actuation electrode or at the several outer or inner actuation electrodes of the actuators 11, 12, 13, respectively, in order to generate piezoelectric or electrostrictive effects at and in the actuators 11, 12, 13, respectively. In this regard, the connection layers 11$z$, 12$z$ can form a continuous rear side layer 4.

Figure 2:
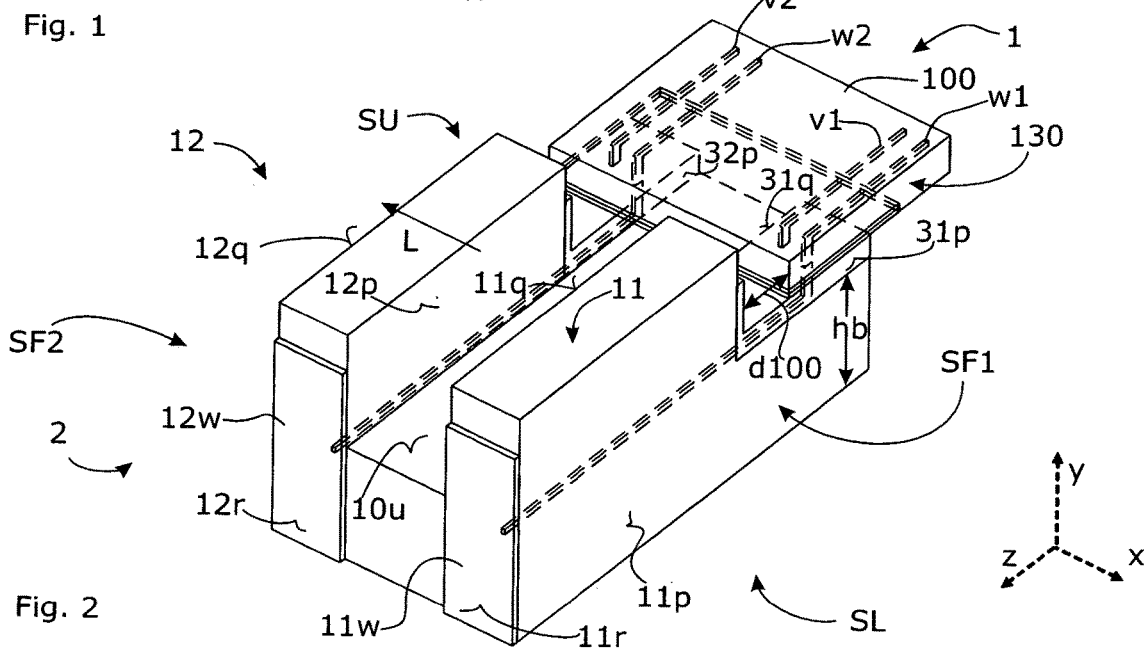
FIG. 2 depicts a perspective presentation of the embodiment of the actuator device according to the disclosure according to FIG. 1 as a view based on a viewing direction on a rear side of the same.
Figure 5:
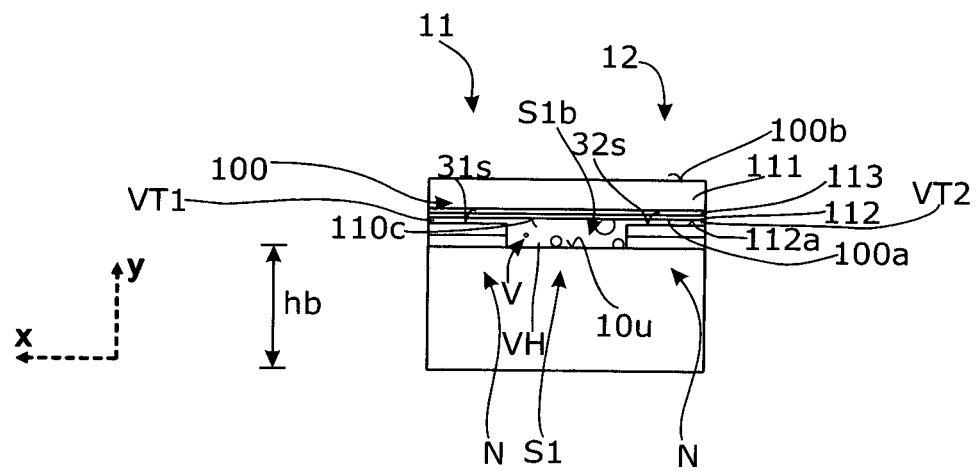
FIG. 5 is a presentation of the cross-section of a variant of the actuator device of FIG. 3 along line L4-L4 which is shown in FIG. 3, wherein additionally between the actuator connection coatings and the printed circuit board resin reinforcement material lies while the resin reinforcement material connects the respective ones.

The actuators 11, 12, 13 respectively comprise actuation electrodes which are disposed at or in a respective actuator body 11$a$, 12$a$, 13$a$ and which are at least in sections distanced from each other. These actuation electrodes of a respective actuator 11, 12, 13 can be realized at least by one or both of the following combinations:

(a) at least two inner actuation electrodes which extend within the respective actuators and in this case in a distance relative to each other in a distance in the Y-direction (FIGS. 9, 10, 11, 13);

(b) at least two outer actuation electrodes (FIGS. 1, 3, 6) which are assigned the reference numerals 31$c$, 32$c$, 33$c$ and which lie at outer sides of the respective actuators and which are lying contrary to each other and which are respectively oriented in the Z-direction and opposed to the Z-direction, respectively, wherein the outer sides which are oriented contrary to each other can be directed, according to FIGS. 1, 2, 5, in and opposed to the X-direction, respectively, or in and opposed to the Z-direction, respectively.

The actuators 11, 12, 13 respectively comprise: an actuator actuation section 11$m$, 12$m$, 13$m$ which protrudes from the base body 10$a$ and which generally is assigned the reference numeral "M," and an actuator connection section which joins the same and which generally is assigned the reference numeral "N" and the respective one actuator connection coating 31$d$, 32$d$, 33$d$ and—depending on the embodiment—optionally an actuator step section 11$n$, 12$n$, 13$n$. In above defined case (a) the actuator actuation section 11$m$, 12$m$, 13$m$ of the respective actuators 11, 12, 13 is respectively formed as part with the respective inner actuation electrodes, the part protruding from the base body 10$a$ of the actuator device AV. In above defined case (b) the respective actuators 11, 12, 13 respectively comprise an actuator actuation section 11$m$, 12$m$, 13$m$ and respectively one electroconductive actuator outer electrode layer 31$c$ and 32$c$ and 33$c$, respectively, as external electrode which lies on the front surface 11$c$ and 12$c$ and 13$c$, respectively, and which is joined with a respective electroconductive actuator connection coating 31$d$, 32$d$, 33$d$, wherein the electroconductive actuator outer electrode layer 31$c$ and 32$c$ and 33$c$, respectively, is oriented contrary to the Z-direction. Further, combinations of the options (a) and (b) can be realized with the actuator device AV according to the disclosure.

In the figures, the respective actuator actuation section 11$m$, 12$m$, 13$m$ of the actuators 11, 12, 13 are generally also the reference numeral "M" and an actuator connection section 11$n$, 12$n$, 13$n$ which is joined thereto opposed to the Z-direction and which respectively comprises an electroconductive actuator connection coating 31d, 32d, 33d and—depending on the embodiment—optionally an actuator step section 11n, 12n, 13n, which is generally assigned the reference numeral "N" also.

The actuator connection coatings 31d, 32d, 33d comprise side surface sections 31p, 31q or 32p, 32q or 33p, 33q, respectively, which run along the Z-direction, wherein the respective two side surface sections 31p and 32q, or 32p and 33q, respectively, of actuators 11, 12, 13 face each other.

In case that actuator step sections 11n, 12n, 13n exist, the same—in an analogous manner—comprise side surface sections 11p, 11q or 12p, 12q or 13p, 13q, respectively, which run along the Z-direction, wherein the respective two side surface sections 31p and 32q, or 32p and 33q, respectively, of respective nearest neighboring actuators 11, 12, 13 face each other.

The actuator actuation sections 11m, 12m, 13m of the main body 10 and of the buildup body 10b, respectively, extend from the base body 10a in the Y-direction in a height hm which in case of the actuator actuation sections 11m, 12m, 13m of an actuator device AV particularly can have equal size. In FIG. 1, as an example, also the height h11a of the actuator actuation section 11m is inserted. Further the widths b1, b2, b3 which extend in the X-direction erstreckenden and the lengths or depths t0 of the actuator actuation sections 11m, 12m, 13m of the actuator device according to the disclosure, respectively, which extend in the Z-direction can have equal magnitude.

The respective actuator actuation sections 11m, 12m, 13m which extend in the depth direction or Z-direction are formed of a piezoelectric or electrostrictive material and with their respective actuator connection coating 31d, 32d, 33d the same extend in the thickness direction or Y-direction from the base body 10a with forming a recess S0, S1, S2, S3 between respective two actuators 11, 12, 13.

Herein, the respective recess S0, S1, S2, S3 is defined as follows:

The area of a respective recess S0, S1, S2, S3 which lies between respective two actuator actuation sections 11m, 12m, 13m and which extends in the Z-direction over the lengths of the respective actuators is in the following referred to as actuation area segment S0a, S1a, S2a, S3a.

The area of a respective recess S0, S1, S2, S3 which lies between respective two actuators 11, 12, 13, the area lying between respective two neighboring actuator connection coatings 31d, 32d, 33b and extending in the Z-direction over the lengths of the respective actuator connection coating 31d, 32d, 33b, is in the following referred to as connection area segment S0b, S1b, S2b, S3b.

In case that the actuators 11, 12, 13 comprise outer actuation electrodes, the surfaces 11c, 12c, 13c of the actuator actuation sections 11m, 12m, 13m which lie at the front side 1 and which are oriented contrary to the depth direction or Z-direction are respectively coated with an actuator outer electrode layer 31c, 32c, 33c which respectively joins an actuator connection coating 31d, 32d, 33b or which respectively is electrically connected to an actuator connection coating 31d, 32d, 33b. In this case, the actuator outer electrode layers 31c, 32c, 33c with respectively one actuator connection coating 31d, 32d, 33b form a respective actuator actuation layer 31a, 32a, 33a.

The electroconductive actuator connection coatings 31d, 32d, 33d which respectively comprises each of the actuators 11, 12, 13 for connection with connection poles of an electric excitation device comprises, are at least in sections disposed as follows:

(i) either on a surface 10u of the base body 10a which is oriented in the thickness direction or Y-direction (FIGS. 1, 3, 10), or (ii) on an actuator step section 11n, 12n, 13n of the actuators 11, 12, 13 which is disposed at the front side 1 and which joins the respective actuator actuation section 11m, 12m, 13m in the depth direction or Z-direction and protrudes from the base body 10a in the Y-direction (FIGS. 6, 9, 11, 12 and 13).

Therefore the connection area segments S0b, S1b, S2b, S3b are delimited when viewed in the Z-direction, thus in the XY-cross-section, by:

side surface sections 31q or 32p, 32q or 33p, respectively, of the actuator connection coatings 31d, 32d, 33d which are lying opposed to each other and facing each other, wherein the actuator connection coatings 31d, 32d, 33d are part of actuators 11 and 12 or 12 and 13, respectively, side surface sections 11q and 12p, or 12q and 13p, respectively, depending on the embodiment, where applicable, which are part of optionally provided actuator step sections 11n, 12n, 13n which are neighboring each other and are lying next to each other, the surface section 10u of the base body 10a which is oriented in the thickness direction Y, and a surface 100a of the printed circuit board 100 which faces the surface section 10u of the base body 10a and which faces the respective recess S0, S1, S2, S3

Thus, between respective two neighboring actuator connection coatings 31d, 32d, 33d a respective connection area segment S0b, S1b, S2b, S3b of the respective recess S0, S1, S2, S3 is disposed. The actuator connection coatings 31d, 32d, 33d are respectively electrically connected to at least one outer electrode which is designed as actuator outer electrode layer 31c, 32c, 33c or with at least one inner electrode of the respective actuator 11, 12, 13, wherein the inner electrode is disposed inside the actuators 11, 12 13 for electrically excitation of the same.

The actuator device AV further comprises a printed circuit board 100 which extends in or along the longitudinal direction X of the actuator device AV over at least sections of the actuator outer electrode layers 31c, 32c, 33c, wherein conductive paths of the same are in electrical contact with the actuator outer electrode layers 31c, 32c, 33c.

According to the disclosure at least one of the connection area segments S0b, S1b, S2b, S3b of the respective recess S0, S1, S2, S3 at least in sections is filled with a cured resin reinforcement material that the resin reinforcement material at least in sections contacts side surface sections 11p, 11q or 12p, 12q or 13p, 13q, respectively, of actuator connection coatings 31d, 32d, 33d which are neighbouring each other, wherein the same are facing each other and delimit the respective connection area segment S0b, S1b, S2b, S3b, the surface section 10u of the base body 10a which is oriented in the thickness direction Y, and the connection surface 100a of the printed circuit board 100 or a connection surface 100a which is facing the surface section 10u of the base body 10a, this means a section 114b of the surface of the respective recess S0, S1, S2, S3 of the printed circuit board 100. Thus the printed circuit board 100 is supported in the area of the connection area segment S0b, S1b, S2b, S3b of a respective recess by the resin reinforcement material and the printed circuit board 100 is additionally fixed by the resin reinforcement material to the actuator connection coatings 31d, 32d, 33d.

It is advantageous, when the resin reinforcement material is disposed also in the respective area between of the printed circuit board and the section of the corresponding actuator outer electrode layer 31c, 32c, 33c, the section being covered by the printed circuit board. Thus, also these areas contribute in that the printed circuit board is fixed to the actuator connection coatings. In this case, the corresponding layer of the resin reinforcement material between of the printed circuit board and the section of the respective actuator outer electrode layer covered by the same is so thin that an galvanic and thereby electroconductive contact is assured between of the printed circuit board and the actuator outer electrode layer.

Generally at the rear side-surfaces 11r, 12r respectively a rear side-sublayer 11w and 12w, respectively, can be disposed at the actuators 11, 12 sein, in which a polarity is generated by the electrical excitation device which is contrary to the polarity which is applied at the outer or inner actuation electrodes of the actuators 11, 12, 13 in order to generate the piezoelectric or electrostrictive effects of in the actuators 11, 12, 13 and in the actuators 11, 12, 13, respectively.

The printed circuit board 100 according to the disclosure can be designed in various ways, insofar as the same provides an electrical connection between the respective actuator connection coatings 31d, 32d, 33d and an electric pole of the electric connection device. The printed circuit board 100 comprises surface 100a which is oriented contrary to the Y-direction or is facing the actuator connection coatings 31d, 32d and the second surface 100b which is oriented opposite to the first surface 100a. The printed circuit board 100 comprises a base plate 111. According to an embodiment of the printed circuit board 100 the same is designed such that at least one conducting path is exposed at the second surface 100b in the area of the respective surface 31s, 32s in order to contact the same. The area 100c of the second surface 100b is the area which delimits the connection area segment S1b.

According to a further embodiment of the printed circuit board 100 the printed circuit board comprises the base plate 111 with a contact outer layer 112 which at least in sections is disposed on a first surface 111a of the base plate 111. The base plate 111 comprises a second surface 111b which is oriented contrary to the first surface 111a which, in the shown embodiment, forms the second surface 100b. At the first surface 111a of the base plate 111 an electroconductive contact outer layer 112 with an outer surface 112a can be disposed.

Figure 4:
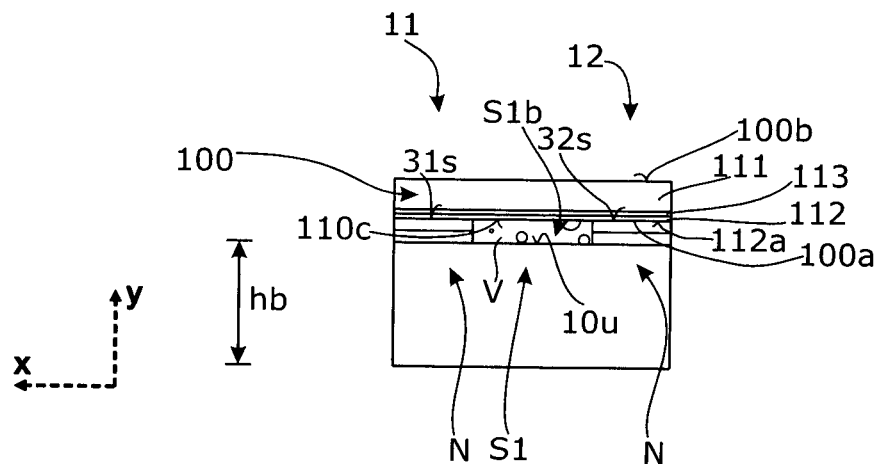
FIG. 4 depicts a presentation of the cross-section of the actuator device of FIG. 3 along line L4-L4 which is shown in FIG. 3, wherein in a space which is limited by the main body, the actuator connection coatings and the printed circuit board, a resin reinforcement material is lying according to the disclosure while connecting the same, wherein the printed circuit board lies directly on the step sections of the actuators.

In the embodiment of FIG. 4, the printed circuit board 100 comprises a contact interlayer 113 which is disposed on the first surface 111a of the base plate 111 and can comprise an electroconductive contact outer layer 112. The area 100c which delimits the connection area segment S1b is, in this embodiment, formed by the outer surface 112a of the contact outer layer 112.

According to the disclosure, embodiments of the actuator devices AV may include the embodiments of printed circuit board 100.

However, in the embodiment of FIG. 1, preferably two conductive paths v1, v2 are provided which are exposed at the second surface 100b so that the respectively at least one conductive path which is exposed respectively contacts the actuator connection coatings 31a, 32a. The printed circuit board 100 is further designed such that their conductive paths—for example by the fact that the same are exposed at a connections section of the printed circuit board 100—are connectable to an electrical excitation device which generates excitations signals, by which the actuators 11, 12, 13 can be actuated for exerting a piezoelectric or electrostrictive effect.

The printed circuit board 100 can comprise at least a further conductive path X1 which is electrically connected not to one of the actuator connection coatings 31d, 32d, 33d, but to the rear side layer 4 or the rear side partial layers 11w, 12w so that the electrical excitation device controls with differing polarities, by means of the actuator connection coatings 31d, 32d, 33d and the rear side layer 4 or the rear side partial layers 11w, 12w, actuation electrodes which are disposed at or in a respective actuator body 11a, 12a, 13a and are distanced from each other.

The actuator device AV according to FIG. 1 comprises a buildup body 10b with two actuator bodies 11a, 12a auf. For forming the actuators 11, 12, at the front side 1 of each of the actuator bodies 11a, 12a an actuator connection coating 31d, 32d is disposed. The actuator device AV according to FIG. 1 does not comprise an actuator step section 11n, 12n, 13n.

At each of the rear side-surfaces 11r, 12r of the actuators 11 and 12, respectively, a rear side-sublayer 11w and 12w, respectively, or a connection layer is disposed, at which a polarity is generated by the electrical excitation device which is contrary to the polarity which is applied at the actuator connection coating 31d, 32d of the respective actuator 11, 12 in order to generate the piezoelectric or electrostrictive effect in the actuators 11, 12.

Thus, the actuator connection coating 31d, 32d comprises solely outer actuation electrodes, namely the connection layers 11z, 12z and the actuator connection coatings 31d, 32d.

As shown in FIG. 4 in detail, the printed circuit board 100 is disposed on the surfaces 31s, 32s of the actuator connection coatings 31c and 32c, respectively, which are oriented along the Y-direction, wherein the surfaces 31s, 32s are in galvanic or electrical contact with the connection surface 100a.

The connection area segment S1b the recess S1 is widely, this means at least in sections filled with cured resin reinforcement material M that a connection layer V made of cured resin reinforcement material contacts at least in sections the side surfaces which are opposed to or face each other and delimit the connection area segment S1b, the surface section 10u of the base body 10a which is oriented in the thickness direction Y and the area 100c of the printed circuit board 100 which faces the surface section 10u of the base body 10a so that the printed circuit board 100 is supported by the resin reinforcement material in the area of the connection area segments S0b, S1b, S2b, S3b of a respective recess and the printed circuit board 100 is fixed by the resin reinforcement material additionally to the actuator connection coatings 31d, 32d, 33d.

Figure 3:
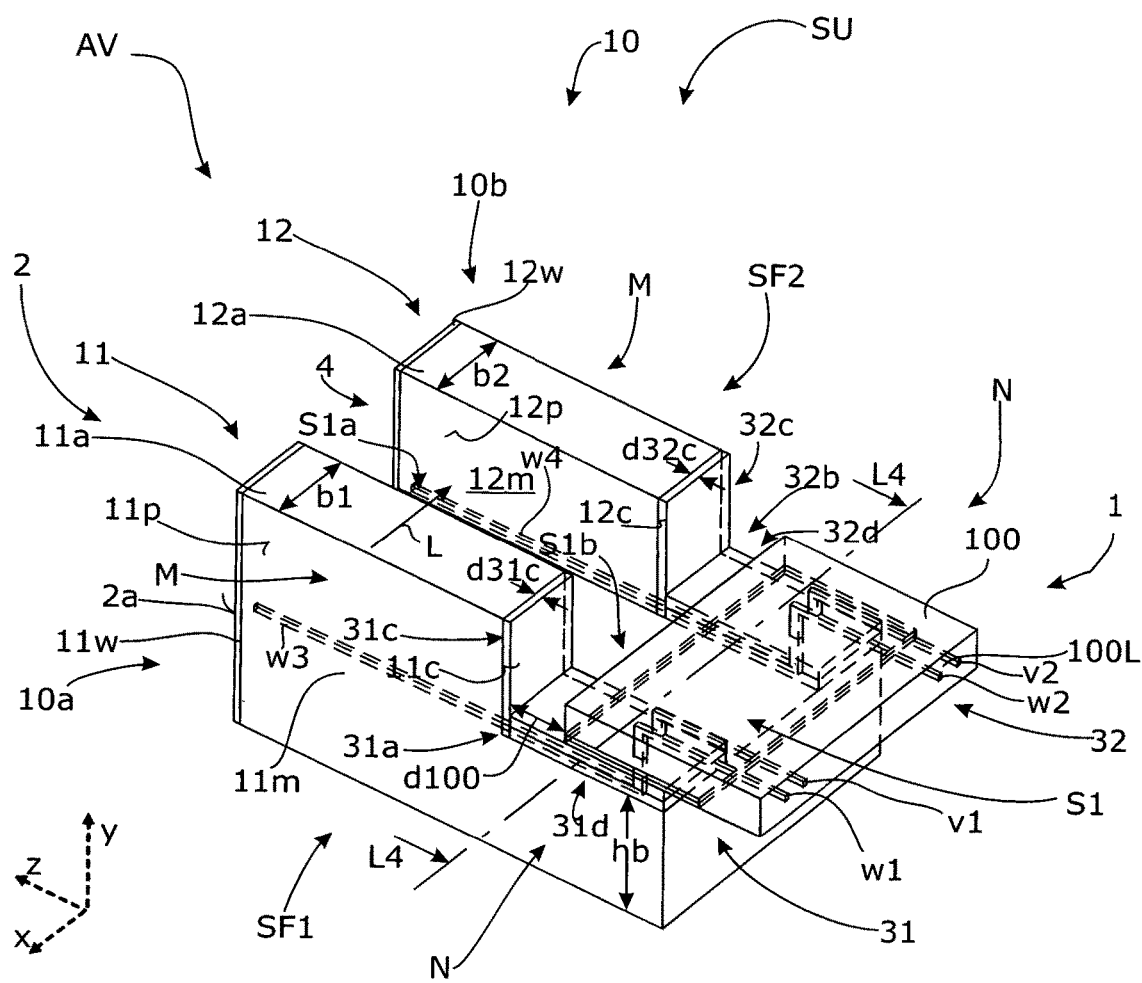
FIG. 3 is a perspective presentation of a further embodiment of the actuator device according to the disclosure in the presentation of FIG. 1, wherein the shown embodiment of the actuator device differs from the embodiment of FIG. 1 in that the actuator connection coating is designed in another manner.

In FIG. 5, a variant of the actuator device of FIGS. 3 and 4 is shown in which the connection layer V is disposed in the connection area segment S1b and additionally respectively as connection sublayer V1, V2 between a respective one of the actuator connection coatings 31d and 32d, respectively, and the printed circuit board 100 in order to join the printed circuit board 100 and the actuator connection coatings 31d and 32d, respectively, by the connection sublayer V1, V2.

Figure 6:
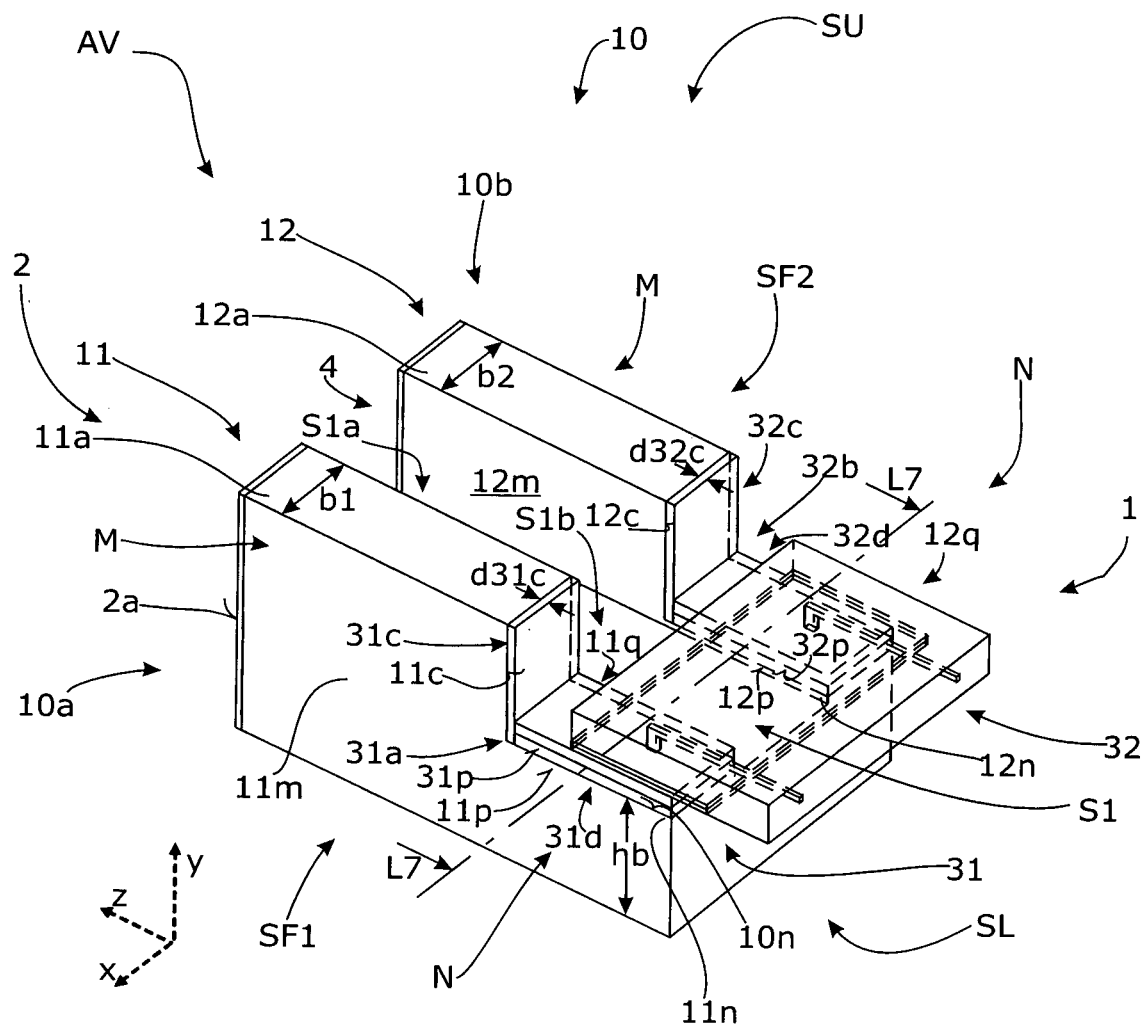
FIG. 6 is a perspective presentation of an embodiment of the actuator device according to the disclosure as a view based on a viewing direction on a front side of the same, wherein the actuator device comprises: a main body which comprises a base body and a buildup body with two actuators which respectively comprises an actuator body, outer electrodes, a step section and a actuator connection coating, as well as a printed circuit board.
Figure 7:
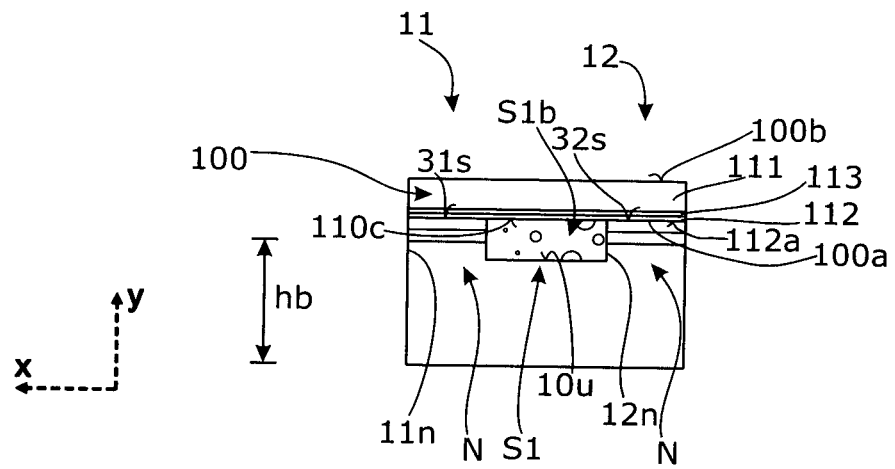
FIG. 7 depicts a presentation of the cross-section of the actuator device of FIG. 6 along line L7-L7 which is shown in FIG. 6, wherein in a space which is limited by the main body, the actuator connection coatings and the printed circuit board, a resin reinforcement material is lying according to the disclosure while connecting the same, wherein the printed circuit board lies directly on the step sections of the actuators.

In FIG. 6, a further embodiment of the actuator device according to the disclosure is shown which differs from the embodiment of the actuator device of the disclosure according to FIG. 1 in that the actuators 11, 12 respectively comprise an actuator step section 11n, 12n. The same comprise side surface sections 11p, 11q and 12p, 12q, respectively, which extend along the Z-direction, wherein the respective two side surface sections 11p, 12q and 12p, 13q, respectively, of respective nearest neighboring actuators 11, 12 are facing each other.

Thus the actuator connection coating 31d, 32d comprises solely outer actuation electrodes, namely the connection layers 11z, 12z and the actuator connection coatings 31d, 32d.

Figure 9:
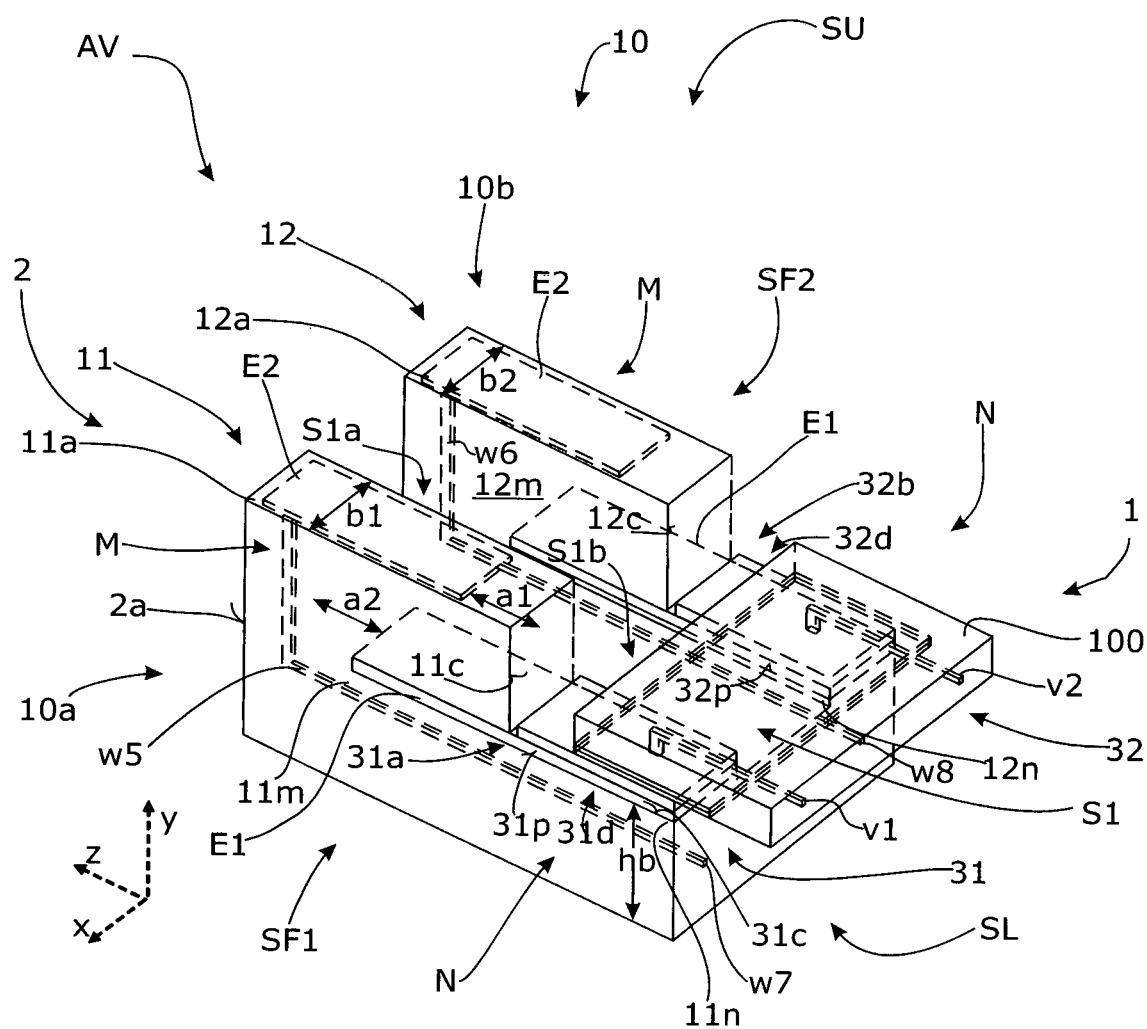
FIG. 9 is a perspective presentation of an embodiment of the actuator device according to the disclosure which differs from the actuator device of FIG. 6 in that each actuator comprises two inner actuation electrodes instead of outer actuation electrodes, wherein each actuator comprises a step section.

FIG. 9 depicts a further embodiment of the actuator device according to the disclosure which differs from the embodiments of the actuator device of the disclosure according to FIGS. 1 and 6. In FIG. 9, each of the actuators 11, 12 of the actuator device AV comprises solely two inner actuation electrodes E1, E2 are disposed which are distanced from each other in the actuator bodies 11a, 12a. With the actuator device AV of FIG. 9, the electrical excitation device is connected by a respective supply line ZE2 to the inner actuation electrode E2 and by a respective actuator connection coating 31d, 32d, 33d to the inner actuation electrode E1.

In the embodiment of the actuator device AV according to FIG. 9, the actuators 11, 12 each respectively comprise an actuator step section 11n, 12n.

Figure 10:
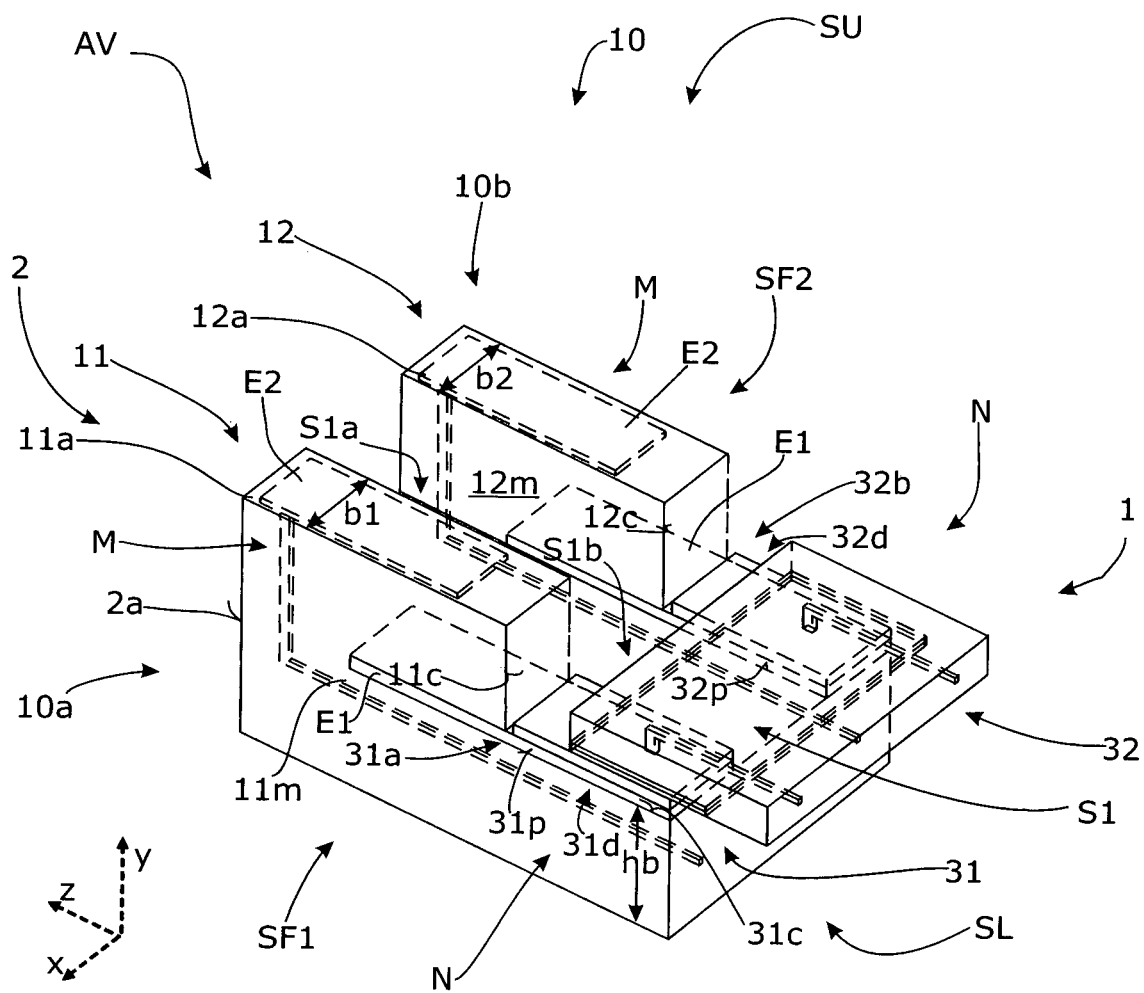
FIG. 10 is a perspective presentation of a further embodiment of the actuator device according to the disclosure which differs from the actuator device of FIG. 9 in that no actuator comprises a step section.

In FIG. 10, a further embodiment of the actuator device according to the disclosure is shown which differs from the embodiments of the actuator device of the disclosure according to FIG. 9, in that the actuator device AV does not comprise an actuator step section 11n, 12n.

Figure 8:
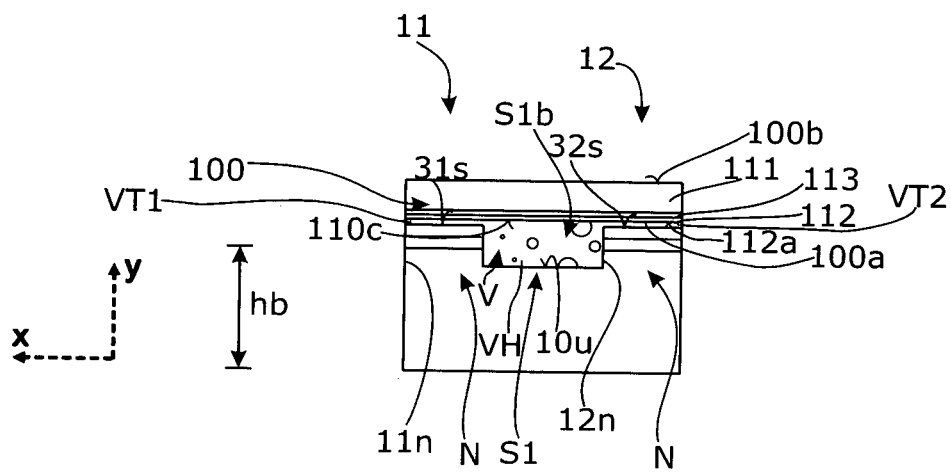
FIG. 8 depicts a cross-section of a variant of the actuator device of FIG. 6 along line L7-L7 which is shown in FIG. 6, wherein additionally between the actuator connection coatings and the printed circuit board a resin reinforcement material lies which connects the respective ones with on another.

As shown in FIGS. 5 and 8, provision can be made that the resin reinforcement material is additionally disposed or lies between the respective extension sublayer 31d, 32d and the printed circuit board 100 for fixation of the printed circuit board 100 at the extension sublayer 31d, 32d, wherein the part of the reinforcement material or the connection sublayer VT1 and VT2, respectively, which lies between the same is connected with the main part VH of the reinforcement material which lies in the connection area segment S1b of the respective recess S1.

The connection partial layers VT1 and VT2, respectively, can be originated during or after the placing of the printed circuit board 100 on the actuator connection coatings 31d, 32d, 33d, when with a corresponding, in advance determinable amount of resin reinforcement material and by placing the same on the extension sublayer an inflow of the resin reinforcement material additionally between the respective extension sublayers and the printed circuit board occurs in order to fix the printed circuit board to the extension sublayer. In this case, the part of the reinforcement material which lies between the those parts these are joined to the part of the reinforcement material which lies in the connection area segment of the respective recess which delimits the extension sublayer. In this case further an amount of resin reinforcement material is disposed in the connection area segments S0b, S1b, S2b, S3b such that the resin reinforcement material contacts the surfaces which delimit the connection area segments S0b, S1b, S2b, S3b.

With the embodiments of the actuator device AV, as with the actuator device AV according to FIGS. 1 to 8, provision can be made that at the surfaces 11c, 12c, 13c of the actuators 11, 12 13 which face the front side 1 electroconductive front side coatings 31c, 32c, 33c as external electrode or outer electrode of the actuators 11, 12, 13 are disposed which are in electrical contact with the actuator connection coatings 31d, 32d, 33d, wherein the front side coatings 31c, 32c, 33c are as external electrode or outer electrode of the actuators 11, 12, 13 electrically connected to a respective actuator outer electrode layer 31c or 32c or 33c, respectively. Each of the front side coatings 31c, 32c, 33c and respectively one rear side-sublayer 11w, 12w of respective the actuator 11, 12, 13 can respectively be connected to polarities of the electric excitation device which are opposite to each other.

With the embodiments of the actuator device AV, as shown with the actuator device AV according to FIGS. 9 and 10, provision can be made that electroconductive front side coatings 31c, 32c, 33c which face the front side 1 are disposed at the surfaces 11c, 12c, 13c of the actuators 11, 12 13, wherein the front side coatings 31c, 32c, 33c are in electrical contact with at least one first inner electrode or first inner electrode E1 at the front side 1 by a respective one of the actuator connection coatings 31d, 32d, 33d, wherein the actuators 11, 12, 13 respectively comprise at least a second inner electrode or inner electrode E2. In this case, generally provision can be made that the actuators 11, 12 respectively comprises at least a first and at least a second inner electrode or inner electrode E1 and E2, respectively, wherein the at least first inner electrode E1 extends in positive depth direction or Z-direction in the respective actuator 11, 12 from the respective front surface 11c and 12c, respectively, to a distance a2 to the surface 2a at the rear side 2, and wherein the at least second inner electrode E3 extends in negative depth direction or Z-direction from the rear side 2 to a distance a1 to the respective front surface 11c and 12c, respectively, at the front side 1, wherein the first inner electrode E1 is electrically connected to the front side coatings and wherein the second inner electrode E2 is electrically connected to the respective rear side-sublayer 11w and 12w, respectively.

Generally, the rear side-sublayers 11w and 12w, respectively, can merge each other or can be layers which are separated from each other at the rear side 2a. In the first case at the rear side 2 of the actuator device AV a continuously coherent, electroconductive rear side coating is disposed which is in electrical contact with the second inner electrodes of the actuators.

Figure 11:
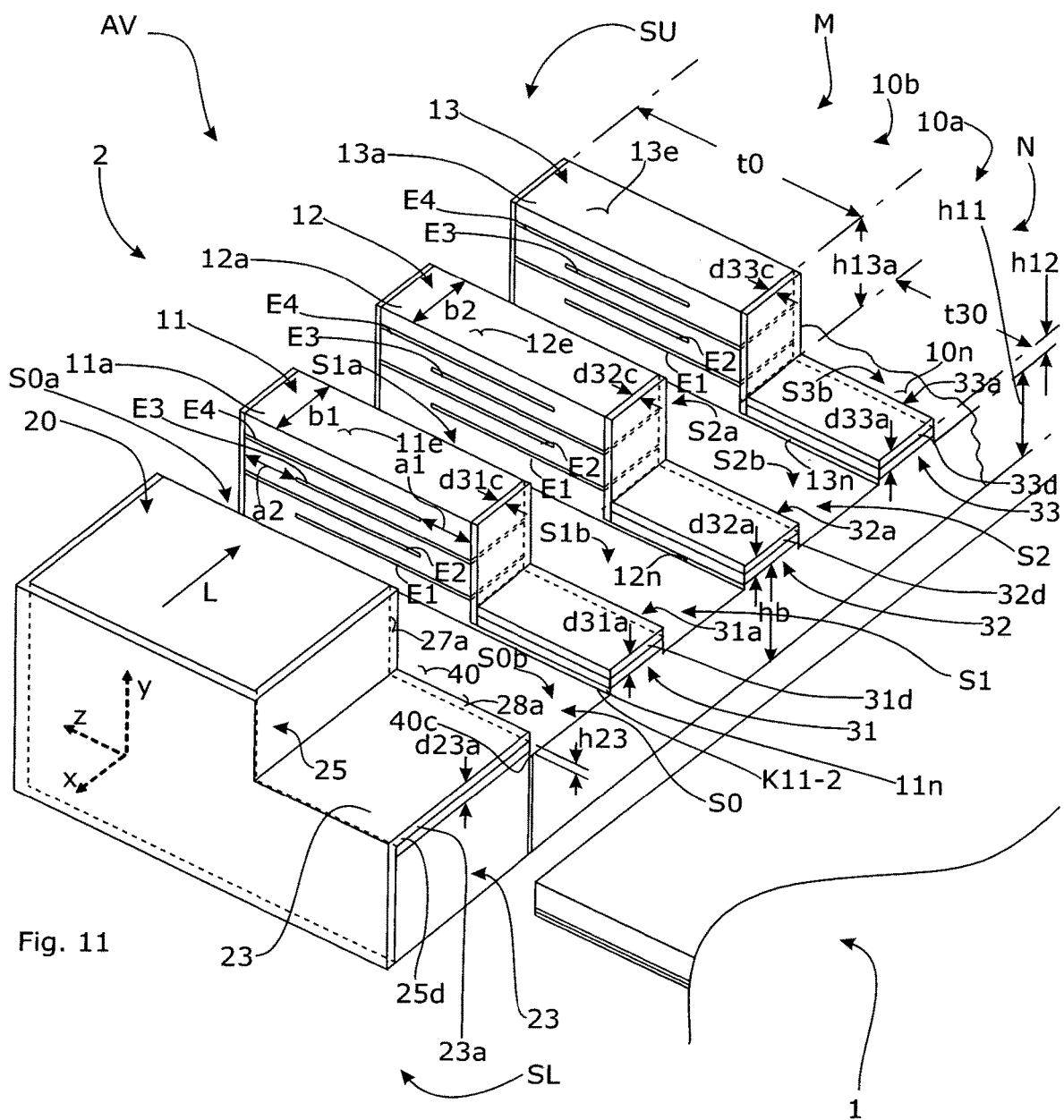
FIG. 11 is a perspective presentation of a part of a further embodiment of the actuator device according to the disclosure by a viewing direction on a front side of the same, wherein each actuator comprises several inner actuation electrodes and wherein the printed circuit board is shown in a state in which the same does not contact the actuator connection coatings.
Figure 12:
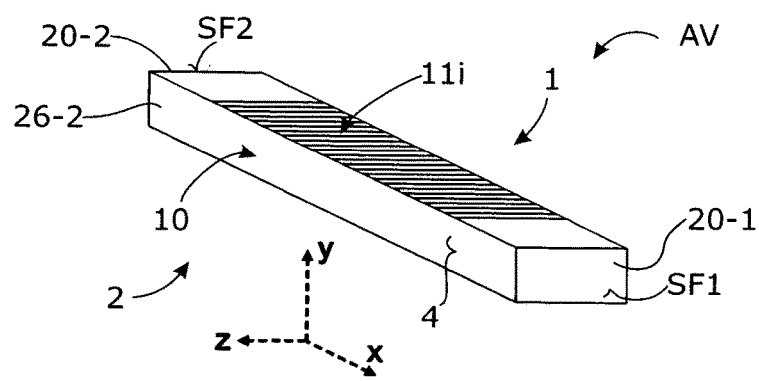
Figure 13:
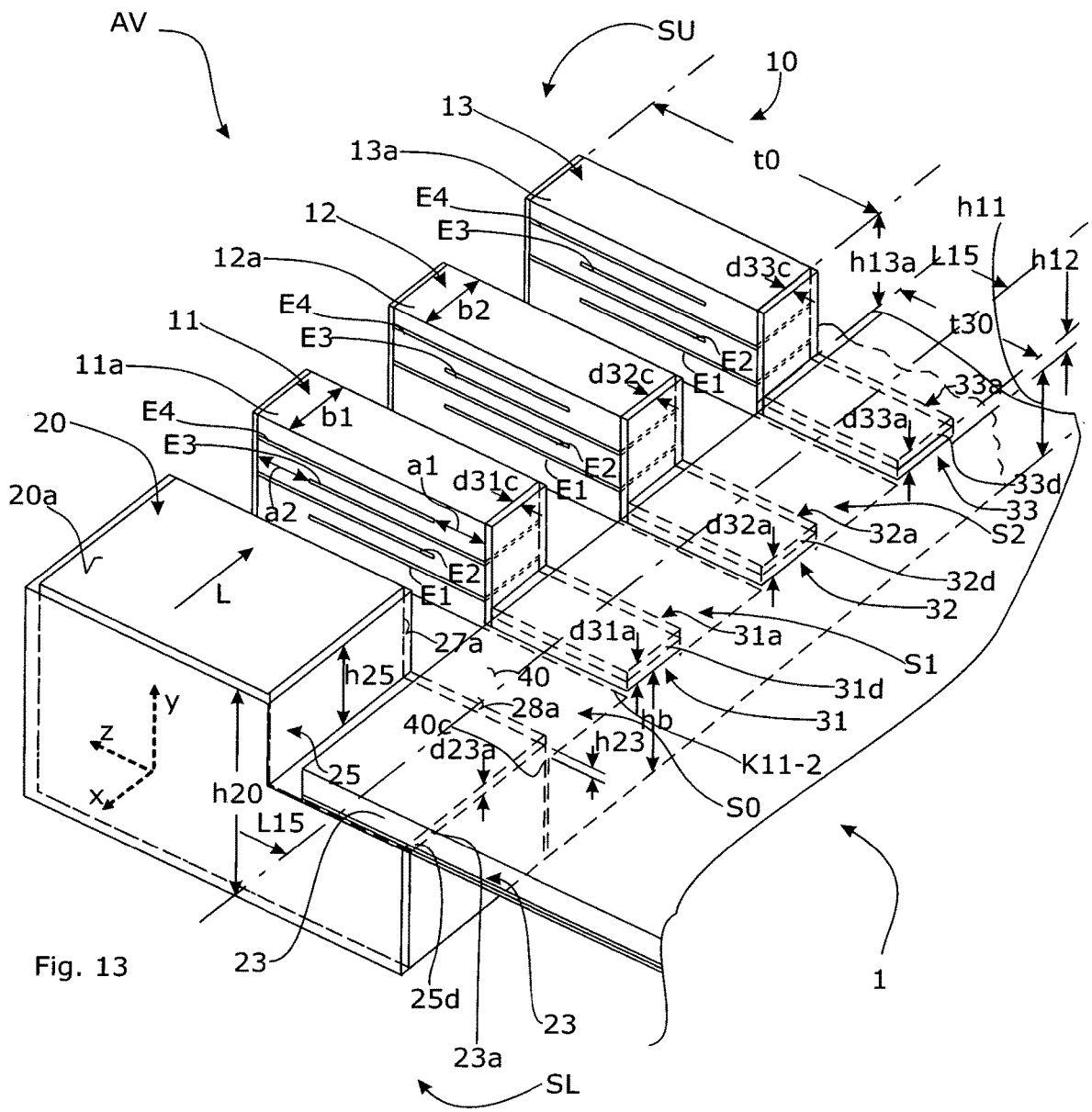
FIG. 13 is an embodiment of the actuator device according to the disclosure according to FIG. 11, wherein the printed circuit board is shown in a state in which the same contacts the actuator connection coatings.
Figure 14:
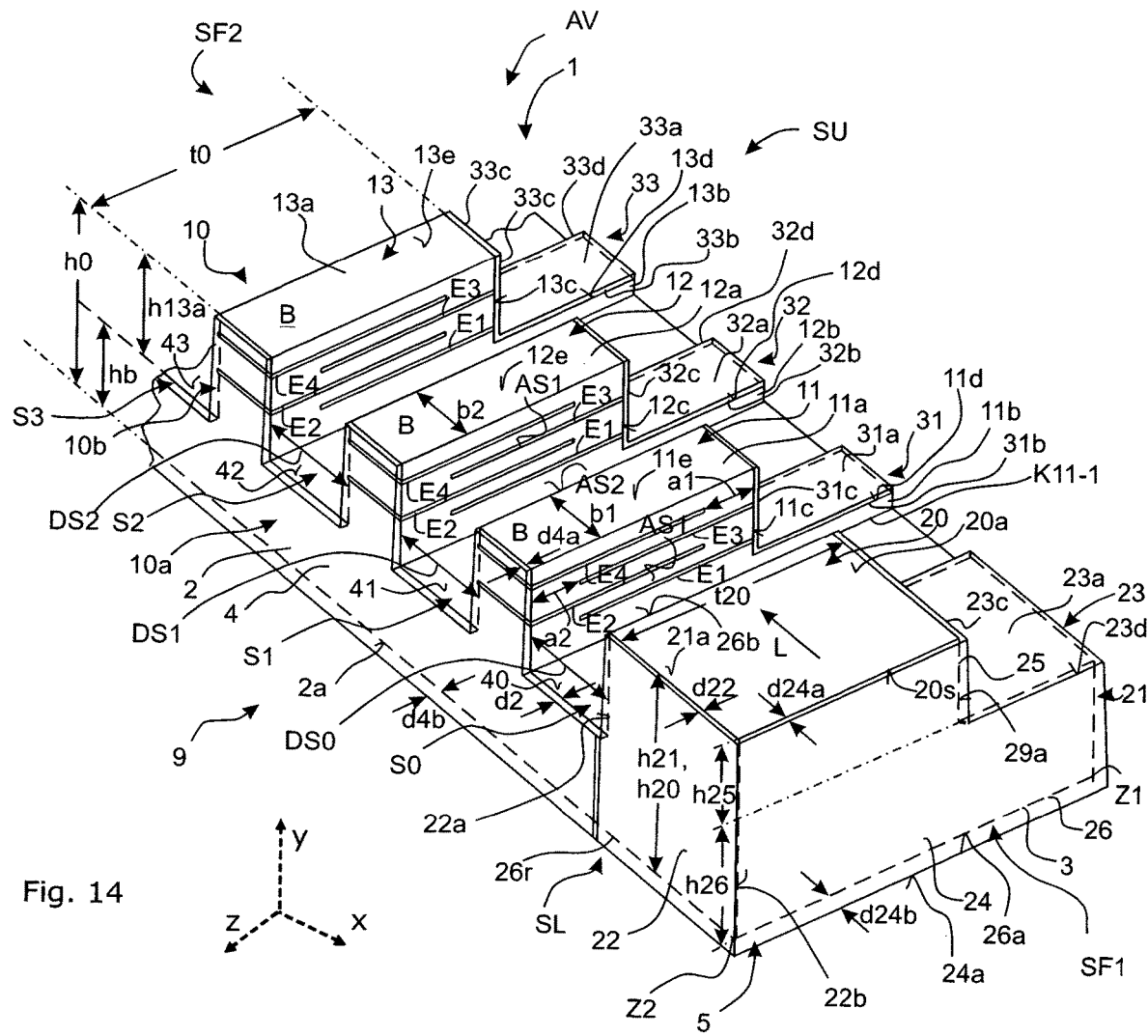
FIG. 14 depicts an embodiment of the actuator device according to the disclosure according to FIG. 11, without printed circuit board.
Figure 15:
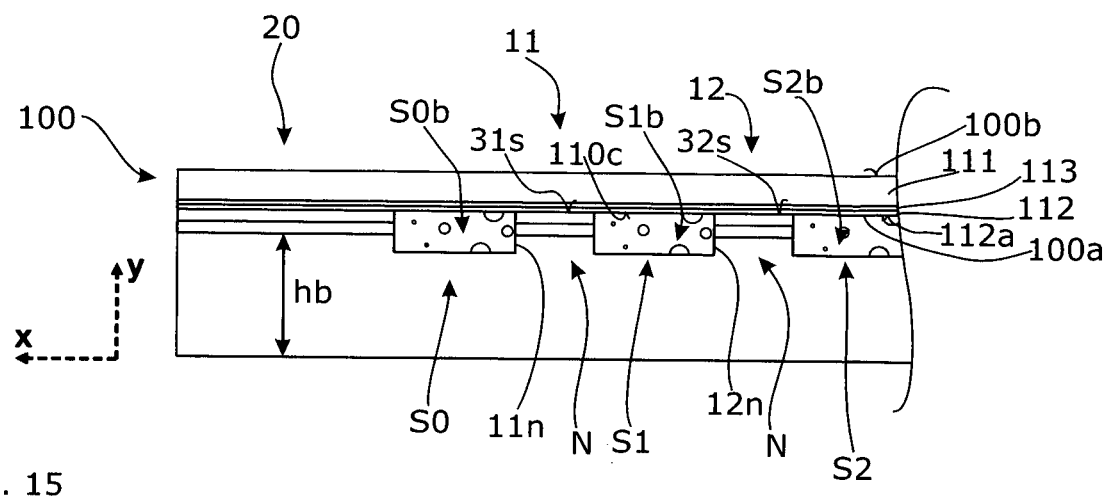
FIG. 15 is a presentation of the cross-section of a part of the actuator device of FIG. 13 along line L15-L15 of the same, wherein in a space which is limited by the main body, the actuator connection coatings and the printed circuit board, a resin reinforcement material is lying according to the disclosure while connecting the same, wherein the printed circuit board lies directly on the step sections of the actuators.

In this regard, generally provision can be made that each of the actuators 11, 12 comprise at least two first and second inner excitation electrodes E1 and E2, respectively (FIG. 11).

The rear side partial layers 11w, 12w can be connected with the electric connection device by an external connection device and particularly external lines. According to a further embodiment which is shown in FIG. 1 at least one conductive path w1, w2 is disposed in the printed circuit board 100. The at least one conductive path w1, w2 can be connected to the electrical connection device. The at least one conductive path w1, w2 can be connected with a connection line w3 and w4, respectively, in the base body 10b. In this regard, as shown in FIG. 1, provision can be made that the connection line w3 and w4, respectively, reaches through the actuator connection coating 31d, 32d, 33d, wherein the connection line w3 and w4, respectively, is isolated in relation to the actuator connection coating 31d, 32d, 33d (not shown). At the respective end of the connection line w3 and w4, respectively, the same is respectively connected with the respective conductive path w1 and w2, respectively. As an alternative or in addition thereto provision can be made that the rear side partial layers 11w, 12w are connected with the electric connection device by an internal connection device, which extends within the base body 10b, and particularly by internal lines w5 and w6, respectively. The same can be connected with the electric connection device by connection devices w7 and w8, respectively, and connection lines which are connected to the lines w5 and w6, respectively. In case that in these embodiments only one rear side layer or coherent rear side partial layers 11w, 12w is or are provided, only one line w5 or w6 can be sufficient.

These features and combinations can be provided according to the disclosure also in case of the embodiments of the actuator device AV which are described with reference to FIGS. 11 to 20.

The actuator device AV according to FIG. 11 comprises more than three actuators, wherein the width DS1, DS2 which extends in the X-direction and between neighboring actuators 11 and 12 or 12 and 13, respectively, have the same size. The actuator device AV comprises a return body 21. Between the actuator 11 and the return body 21 a recess S0 with a width DS0 which extends in the X-direction is disposed, wherein the recess S0 comprises a surface 40 which extends in the Y-direction. Particularly provision can be made that the widths DS1, DS2 which extend between respective two actuators neighboring each other in the X-direction have the same size as the width DS0 which extends between the return body 21 and the neighboring actuator 11.

The section of the main body 10 which, when viewed in the Y-direction, extends to the surfaces 40, 41, 42 of the recesses S0, S1, S2 forms the base body 10a, wherein the surfaces 40, 41, 42 are oriented in the Y-direction and join the sides AS1, AS2, respectively, which face each other. As an example, in the figures above, the height h43 of the base body 10a at the recess S3 is inserted, wherein in case of the shown embodiments the heights [h43] have the same sizes, however can also have different sizes with regard to each other.

The actuators 11, 12, 13 of the actuator device according to the disclosure can expand or contract themselves in the thickness direction Y due to an actuation by the electrical actuation device, this means by applying an electric voltage. In this manner, the same can act on, for example, part or partial areas of an application component which are to be adjusted or which have a shape which can be controlled.

The actuator device AV according to the disclosure can for example be embodied as piezo motor. Further, the actuator device AV according to the disclosure can be designed as ultrasonic transducer, particularly as ultrasonic array or linear array. Further, an application of the disclosure, the application component can be a container device of an printing means dispenser device of a printer and particularly of an inkjet printer with a plurality of partial containers which have a controllable shape so that, due to a change of the shape of a partial container by an actuator according to the disclosure, a printing means can be displaced through a valve of the partial container, wherein the printing means can be ink as in the case of an inkjet printer. Another application component can be an injection device of a motor and the partial container can be a container for holding and spraying out of propellant, which is effected by actuation of actuators which are provided according to the disclosure and which contact the partial containers.

The applications described above is the so-called inverse piezoelectric effect which generates a deformation of the actuator or actor due to the application of an electric voltage. However, it is also possible that the piezoelectric effect is used by the actuator device according to the disclosure, for example in the form of a sensor. When utilizing a plurality of actors, for example a sensor for capturing a position can be considered.

The actuator device AV comprises further: a front side 1, a rear side 2 which is oriented contrary to the front side 1 in relation to a longitudinal direction X of the actuator device AV, a lower side SL which is oriented in the negative Y-direction, and an upper side SU which is oriented in the positive Y-direction. The front side 1 is disposed on a side which lies contrary to the rear side 2, when viewed in longitudinal direction X and in relation to the position of the actuators 11, 12, 13. Thus, the front side 1 is disposed beyond the rear side 2 in relation to the actuators 11, 12, 13. The rear side 2 of the main body 10 is formed of a surface 2a which is a coherent and particularly flat surface. In this context, "coherent" means that the surface extends along the X-direction. In this regard, particularly provision can be made that the surface 2a has a unitary curvature over its extension, therefore has no turning point.

The main body 10 comprises a base body 10a and a buildup body 10b with actuator bodies 11a, 12a, 13a which extend from the base body 10a in the thickness direction Y and which form the actuators 11, 12, 13. The actuator bodies 11a, 12a, 13a are formed of a piezoelectric or electrostrictive material and, for example of PZT, At least in some of the actuator bodies 11a, 12a, 13a actuation electrodes are disposed which can be actuated by an actuation device. The respective actuator body 11a, 12a, 13a with actuation electrodes respectively disposed in the same, respectively form an actuator 11, 12, 13. Each actuator body 11a, 12a, 13a comprises an upper surface 11e, 12e, 13e, respectively, which are therefore part of the upper side SU.

The widths b which extend in the X-direction and the lengths or depths t0 of the actuator body 11a, 12a, 13a of the actuator device according to the disclosure, which extend in the Z-direction, can particularly have the same size.

In the shown embodiments of the actuator device according to the disclosure, the actuators 11, 12, 13 are disposed next to each other and in X-direction behind each other, respectively, such that between respective two actuators— for example between the actuators 11, 12, 13—a recess S1, S2 is formed which has a width DS1 and DS2, respectively, which extends in the X-direction and which is formed by surfaces 41, 42 which are oriented in the Y-direction. The recesses S1 and S2 are therefore delimited by the surface 41 and 42, respectively, and the sides AS1, AS2 of respective neighboring actuators 11 and 12 and 12 and 13, respectively, which face each other. The width (for example DS1, DS2) which extends in the X-direction between actuators (for example actuators 11 and 12) which are neighboring each other can particularly have the same size. As an alternative thereto, the widths can be of different sizes. Further, between the actuator 11 and the return body 21 a recess S0 is disposed with a width DS0 in the X-direction and with a surface 40 which is oriented in the Y-direction. Particularly provision can be made that the widths DS1, DS2 between respective two actuators which are neighboring each other in the X-direction have the same size as the width DS0 between the return body 21 and the neighboring actor 11.

The section of the main body 10 which extends to the surfaces 40, 41, 42 of the recesses S0, S1, S2 in the Y-direction forms the base body 10a. As an example, in FIG. 1 the height h43 of the recess S3 is inserted. Thus, the base body 10a has the height h43 at this position.

Preferably, provision is made that the main body 10 is formed as block so that the main body 10 is formed uniformly by a base material. Thereby provision can also be made that the outer contour which is formed of the outer surfaces of the main body 10 has a rectangular block. The virtual upper side of the main body 10 is partially formed of the surfaces 40, 41, 42 and of virtual connecting surfaces which lie between the same and join the same. The virtual connecting surfaces can particularly be defined such that the same have a minimal curvature between the surfaces 40, 41, 42 over the complete respective connecting surface. The actuators 11, 12, 13 are preferably formed as one piece with the main body 10 and join the same so that the actuators 11, 12, 13 are connected to the main body 10 flat and fixedly in their respective connection area so that neither the actuator 11, 12, 13 completely nor a partial section of the respective actuator 11, 12, 13 has a freedom of movement with regard to the main body 10.

The actuator body 11a, 12a, 13a of the main body 10 and of the buildup body 10b, respectively, extend from the base body 10a in the Y-direction in a height which has the same size particularly for the actuator body 11a, 12a, 13a of the actuator device according to the disclosure. As an example, in FIG. 1, the height h13a of the actuator body 13a is inserted.

The actuators 11, 12, 13 respectively comprise at least two inner actuation electrodes which are disposed in a plurality of actuators. At least a first inner actuation electrode E1, E3 extends from the front side 1 to a distance a2 to the rear side 2 of the actuator device AV and at least a second inner actuation electrode E2, E4 extends from the rear side 2 to a distance a1 to the front side 1. In case of an electrical control, the at least one first inner actuation electrode E1, E3 and the at least one second inner actuation electrode E2, E4 with electric polarities being contrary to each other by an actuation device which is connected with the actuation electrodes, an expansion or a contraction of the piezoelectric or electrostrictive material is effected which lies between the two electrodes, and thereby, in the Y-direction, of the actuator in which the same are disposed.

The surface of an embodiment of the actuator device according to the disclosure which is oriented in the Y-direction can be provided without an electroconductive layer in the area of the actuators 11, 12, 13, as shown in FIG. 1. With this embodiment, both the surfaces 11e, 12e, 13e and the side walls of the actuators 11, 12, 13 which are oriented in the X-direction and the surfaces 41, 42 of the recesses S2, S3 are uncoated.

The actuation device is connectable to the first electrodes E1, E3 at the front side 1 with providing a first electric polarity. For this purpose, each actuator 11, 12, 13 to be controlled can comprise a direct connection coating or first connection layer or actuator connection coating 31a, 32a, 33a which are made of an electrically conductive and particularly metallic material, wherein the same are electrically connected with the first inner actuation electrodes E1, E3, and particularly can be directly with the same. Thereby the first polarity or the first pole of the actuator device AV is affected. The actuator connection coating 31a, 32a, 33a is particularly formed of a layer 31c, 32c, 33c made of an electroconductive and particularly metallic material which lies on the side surface or front surface 11c, 12c, 13c of the respective actuators 11, 12, 13, wherein the front surfaces 11c, 12c, 13c are oriented in the negative Z-direction. The layer 31c, 32c, 33c is electrically connected with the first inner actuation electrodes E1, E3 and, particularly, is directly connected with the same.

In the shown embodiments of the actuator device AV, each actuator body 11a, 12a, 13a comprises a step or a tongue-shaped connection part or a tongue-shaped prolongation 11b, 12b, 13b which extends in the Z-direction so that the respective actuator body 11a, 12a, 13a is formed from an actuator body actuation part B and a connection part 11b, 12b, 13b with a depth or length t30 extending in the Z-direction. The surfaces of the connection parts 11b, 12b, 13b which extend in the Y-direction are respectively coated with an actuator connection coating 31a, 32a, 33a made of an electroconductive and particularly metallic material. Thus, with this embodiment the actuator connection coating 31a, 32a, 33a is formed by the sublayer or actuation part connection layer 31c, 32c, 33c with the thickness d31c, d32c, d33c which lies on the respective side surface of the actuator body actuation part B and by the actuator connection coating with the thickness d31b, d32b, d33b which lies on the tongue-shaped prolongations 31b, 32b, 33b. Further, the sublayer 31c, 32c, 33c which lies on the side surface 11c, 12c, 13c of the respective actuator 11, 12, 13 and is oriented in the negative Z-direction is connected with the actuation part connection layer 31c, 32c, 33c and can particularly be formed as one part with the actuation part connection layer 31c, 32c, 33c in order to form a unitary first connection coating 31a, 32a, 33a. In this manner the respective first pole of the actuation device can be connected to the actuator connection coating 31a, 32a, 33a.

With a further embodiment of the actuator device according to the disclosure the same can also be designed such that the same does not comprise a tongue-shaped connection part or tongue-shaped prolongation 11b, 12b, 13b with a respective actuator connection coating 31a, 32a, 33a so that the sublayers or actuation part connection layers 31c, 32c, 33c form the electric connections for the actuation device or the first pole.

The actuator device AV according to the disclosure comprises a return segment 20 for forming a second electric pole. The return segment 20 comprises the return body 21 and further a return section 26 with a return section surface 26a which is oriented in the negative X-direction and a support section 25 which extends in the Y-direction from the same. When viewed in the Y-direction, the return section 26 has a height h26 and the support section 25 has a height h25 so that with the embodiment of FIG. 1, the return body 21 has a height h21=h26+h25.

With an embodiment of the actuator device according to the disclosure the actuator bodies 11a, 12a, 13a are disposed one behind the other in the longitudinal direction or the x-direction and the return body 21 is disposed behind the row of actuator bodies 11a, 12a, 13a when viewed in the x-direction. In this regard, it can particularly be provided that the surface 26r of the return body 21 and the surface 2a the rear side 2 of the main body 10 form a coherent and particularly flat surface. In this context, "coherent" means that the surface extends along the X-direction. In this regard, particularly provision can be made that the surface has a unitary curvature over its extension, therefore has no turning point.

The surface area of the return section 26 at the rear side 2 is assigned the reference numeral 26r.

In FIG. 1a, an embodiment of the actuator device according to the disclosure is shown which comprises at each front side SF1, SF2 which lie opposite to each other in X-direction a return segment 20-1, 20-2. In the further figures a return segment is generally assigned the reference numeral 20 and the embodiments of the same which are described herein can be disposed at each of the front sides SF1, SF2. According to one of the embodiments described herein, the return segments 20-1 and 20-2, respectively, can particularly be designed identically to each other. In the presentation of FIG. 1, the actuators are schematically drawn by single lines and are summarily assigned the reference numeral 11i.

The X-coordinate of the coordinate systems which are used herein can particularly be defined such that the origins of the coordinate systems lie in the center of the edge section which connects the return section surface 26a and the lower side SL. In this case, the X-coordinate runs across the longitudinal extension of the actuators 11, 12, 13 which extend from the front side 1 to the rear side 2, and through the center of an edge section which delimits the lower side SL in the positive X-direction. The edge section can particularly be an edge section which joins a surface, which is oriented contrary to the return section surface 26a in relation to the Y-direction and which contacts the lower side SL, with the lower side SL. For the definition of the coordinate systems the Z-axis runs through the both front, lower edge points Z1, Z2 of the actuator device AV, the edge points Z1, Z2 therefore lying at the return section surface 26a. In this regard, the point Z1 is defined as intersection point of the lower side SL, of the return section surface 26a and the front side 1 and the point Z2 is defined as intersection point of the lower side SL, the return section surface 26a and the rear side 2.

For the mentioned edge section or the points Z1, Z2 an idealised edge section or an idealized point can be utilized, in case that with a design or realization of the actuator device according to the disclosure at positions at which the edge section or the points are assumed, a rounded transition section and a rounded corner, respectively, is provided. In this case according to the herein given definition that the edge section or the points for definition of the attitude of the coordinate systems at the actuator device AV is set by the prolongation of the extension of the respective surfaces or sides utilized thereby, this means, if applicable, the return section surface 26a, the front side 1, the lower side SL, the return section surface 26a or the rear side 2.

Herein, with correspondingly rounded surface areas, generally for definition of an edge line or of a point an idealized edge line and an idealized point, respectively, can be utilized which is generated by the intersection point of prolongations of the extension of respective two neighboring surfaces approach each other. In this context, by extension a length of 1/10 of the length can be understood over which the respective surface extends in the respectively relevant direction defining the same.

The surface 21a of the return body 21 which is oriented in the Y-direction is uncoated in the embodiment of FIG. 1 so that the surface 21a of the return body 21 is identical with the surface 21a of the return segments 20.

Generally in case of the embodiments of the actuator device according to the disclosure, as an alternative thereto or in addition thereto for coating of the return section surface 26a which is oriented in the negative X-direction, also the return section surface 26b which is oriented in the positive X-direction and which faces the actuator 11 can be coated with an electroconductive layer.

The return section 26 can comprise an additional return part or return connection part 23 which particularly can be designed as support section and which is disposed in the area of the connection parts 11b, 12b, 13b when viewed in the negative Z-direction. The return connection part 23 extends from the surface 40 in the Y-direction with the height h23. With the embodiments of the actuator device according to the disclosure generally provision can be made that the return connection part 23 is coated with an electroconductive and particularly metallic return connection coating or outer connection layer 23a with the thickness d23a at its surface 23d which is oriented in the positive Y-direction, the outer connection layer 23a forming a second electric pole for connection of the actuation device.

The rear side 2 of the main body 10 is coated with a rear side layer 4 made of an electroconductive and particularly metallic material. The thickness of the rear side layer 4 can be constant in the X-direction and in the Z-direction. Further, generally with the embodiments of the actuator device according to the disclosure provision can be made that the thickness d4b of the rear side layer 4 in the area of the base body 10a which borders the lower side SL is higher than the thickness d4a of the rear side layer 4 in the area of the buildup body 10b which borders the upper side SU, wherein particularly provision can be made that the amount of the thickness d4b is greater by the factor 1.5 in relation to the thickness d4a.

The rear side layer 4 is electrically connected with the second inner actuation electrodes E2, E4 of the actuator device AV and is particularly directly connected with the same. The rear side layer 4 electrically connected with return outer layer 5 and particularly formed as one part with the same, wherein the return outer layer 5 is connected with the return connection section 23a and particularly formed as one part with the same.

In the embodiment of FIG. 1, the return outer layer 5 is formed of a front side coating section 24 with surface 24a which is electrically connected with a rear side coating section 22 the rear side layer 4. The thickness of the front side coating section 24 can be constant in the Y-direction and in the Z-direction. Also, generally with the embodiments of the actuator device according to the disclosure, provision can be made that the thickness d24b at and in the area of the lower side, respectively, is greater than the thickness d24a of the front side coating section 24 at and in the area of the upper side SU, respectively, wherein particularly provision can be made that the thickness d24b is greater by the factor 1.5 in relation to the thickness d4a.

In order to control the actuators 11, 12, 13, or some of the actuators 11, 12, 13 separately, the electrical actuation device can comprise several first electrical poles and the actuation device can be designed such that the same can generate for each of the first electric poles different control voltages and control currents, respectively, so that with this embodiment the actuation device can actuate the actuators 11, 12, 13 individually and differently, respectively. According to a further embodiment provision can be made that all of the actuators 11, 12, 13 or some actuators 11, 12, 13 of the actuation device AV can be actuated individually at a single first electric pole so that the same can be actuated in the same manner.

The second pole of the actuation device can also be connected or is connected, respectively, at the front side 1 of the actuator device AV and, in case of the embodiment according to FIG. 1, can be connected to the return connection coating 23a. For this purpose, the actuator device AV according to the disclosure comprises an outer connection layer or return connection layer 5 with which the rear side layer 4 is electrically connected, preferably with forming one piece.

The return body 21 can also consist solely of the return section 26 as component of the base section 10a so that the same does not comprise a support section 25 which is disposed in the Y-direction (FIGS. 19 to 30) so that the return body 21 has a height h21=h26 hat.

Depending on the method for manufacturing the main body 10 or the actuator device AV, the return body 21 actuator section 9 of the main body 10 can be formed as one piece and in total as monolithic block. As an alternative thereto, according to an alternative method for manufacturing of the main body 10 or of the actuator device AV, the return body 21 is formed as separate piece with regard to the actuator section 9 and is bonded to the actuator section 9. For this case, FIGS. 1 and 2 schematically depict a bonding layer 50.

Depending on the embodiment of the return body 21, the bonding layer 50 can be disposed also at another position and particularly shifted in the X-direction with regard to the position shown in FIG. 1. In this case, the return body 21 can also form a part of the area of the main body 10 which extends in the Y-direction, in which the recess 40 is situated so that the bonding layer 50 is situated in the area of the recess 40, when viewed in the X-direction. Also, the bonding layer 50 can extend in an angle and in this regard, for example, in an acute angle in relation to the Y-axis and along the Z-direction.

When forming the return body 21 from the return section 26 and the support section 25, provision can particularly be made that the upper side 21a of the return body 21 has the same height as the actuator body surfaces 11e, 12e, 13e of the actuators 11, 12, 13, when viewed in the Y-direction, so that h0=h21 so that an application component with a controllable shape can be positioned on the upper side SU of the actuator device according to the disclosure and thus on the actuators 11, 12, 13 or the actuator body 11a, 12a, 13a and on the surface 21a. With this embodiment of the actuator device according to the disclosure the return body 21 with the support section 25 additionally have a support function in addition to the function of returning the current over the return connection layer 5, by the fact that the support section 25 receives and holds a corresponding section of such an application component. In this case provision can particularly be made that—as shown in FIG. 1—the upper side 21a of the same is not coated with an electroconductive material. With the embodiment according to FIG. 1 the return connection layer 5 is formed of a coating section 22 at the rear side 2 and a coating section 24 at the first front side SF1 which in turn is connected with the return connection coating 23a. These layers are formed of an electroconductive material. In this manner a current flow which is particularly effective with a simple and advantageous method of manufacturing the actuator device according to the disclosure is ensured.

With the embodiments of the actuator device according to the disclosure, generally provision can be made that at the front side SF1 which is oriented in the negative X-direction the return segment 20 is formed. At a front side (not shown) of the actuator device according to the disclosure which is oriented in the positive X-direction a return segment 20 according to an embodiment of the same described herein can also be formed which is identical or differently to the return segment 20 which is disposed at the front side which is lying opposed. As an alternative thereto at the front side (not shown) of the actuator device according to the disclosure which is oriented in the positive X-direction an actuator can be disposed.

Figure 16:
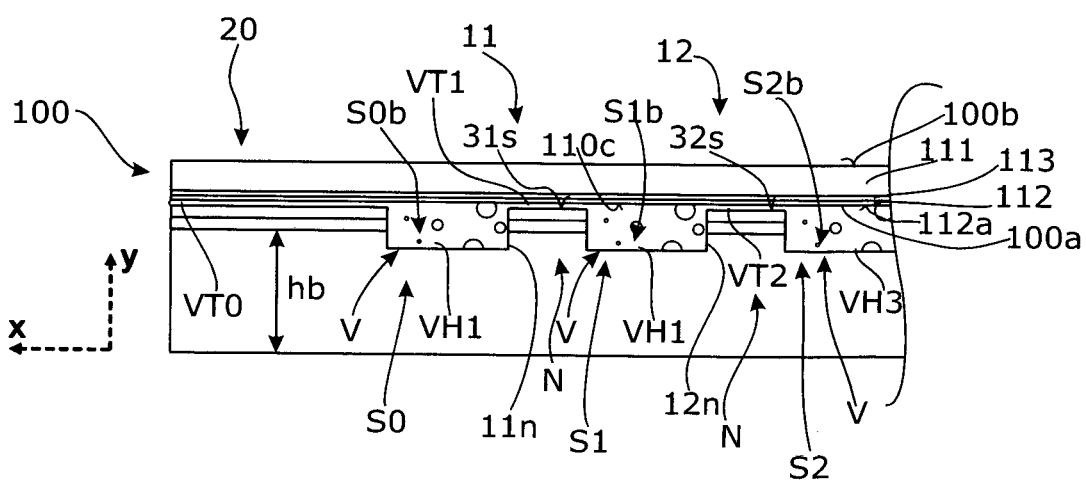
FIG. 16 is a presentation of the cross-section of a part of the actuator device of FIG. 13 along line L15-L15 of the same, wherein additionally between the actuator connection coatings and the printed circuit board a resin reinforcement material lies which connects the respective ones with on another.
Figure 17:
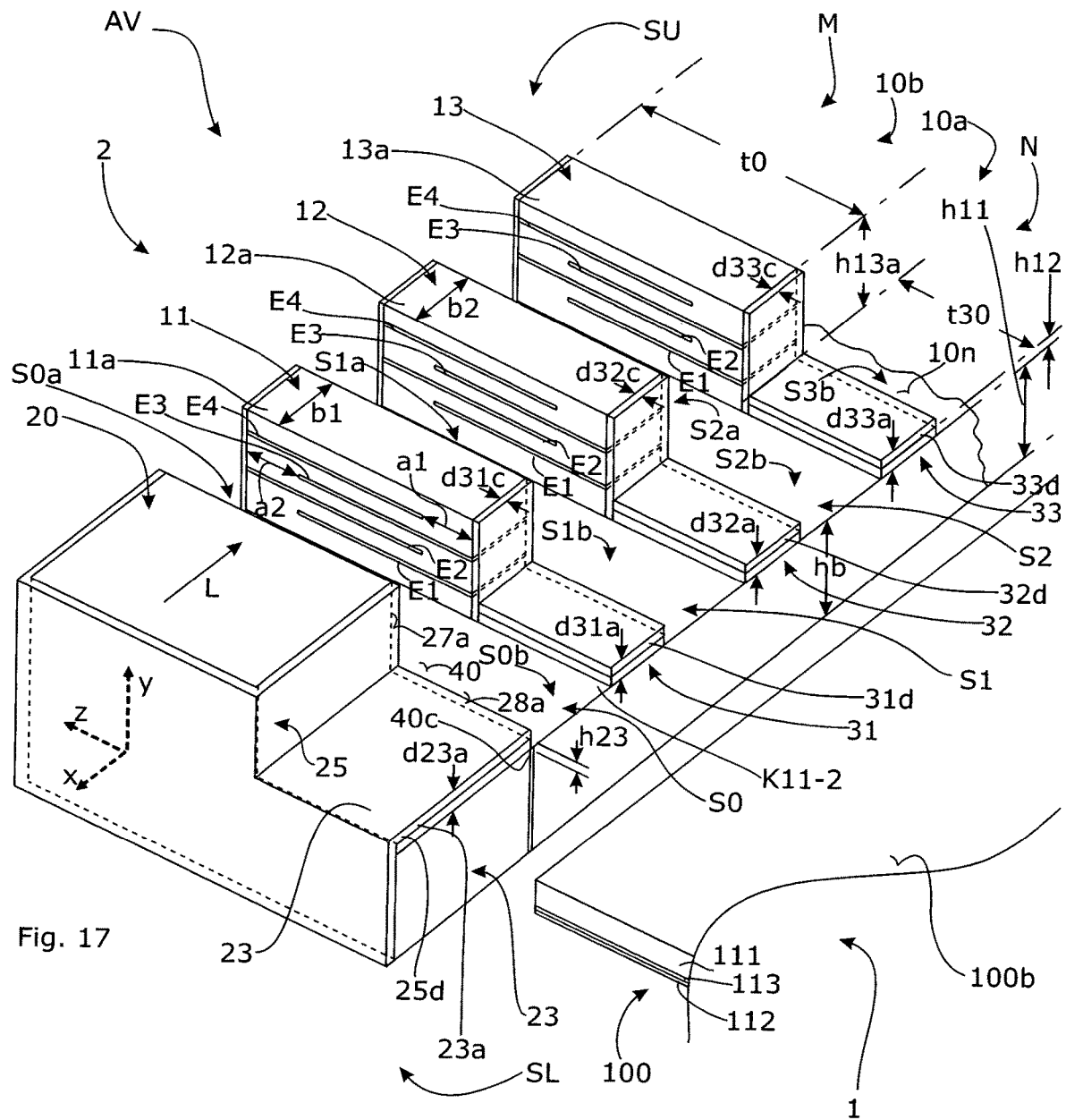
FIG. 17 is a perspective presentation of a part of a further embodiment of the actuator device according to the disclosure based on a viewing direction on a front side of the same, wherein none of the actuator device comprises a step section compared with the actuator device of FIG. 13.
Figure 18:
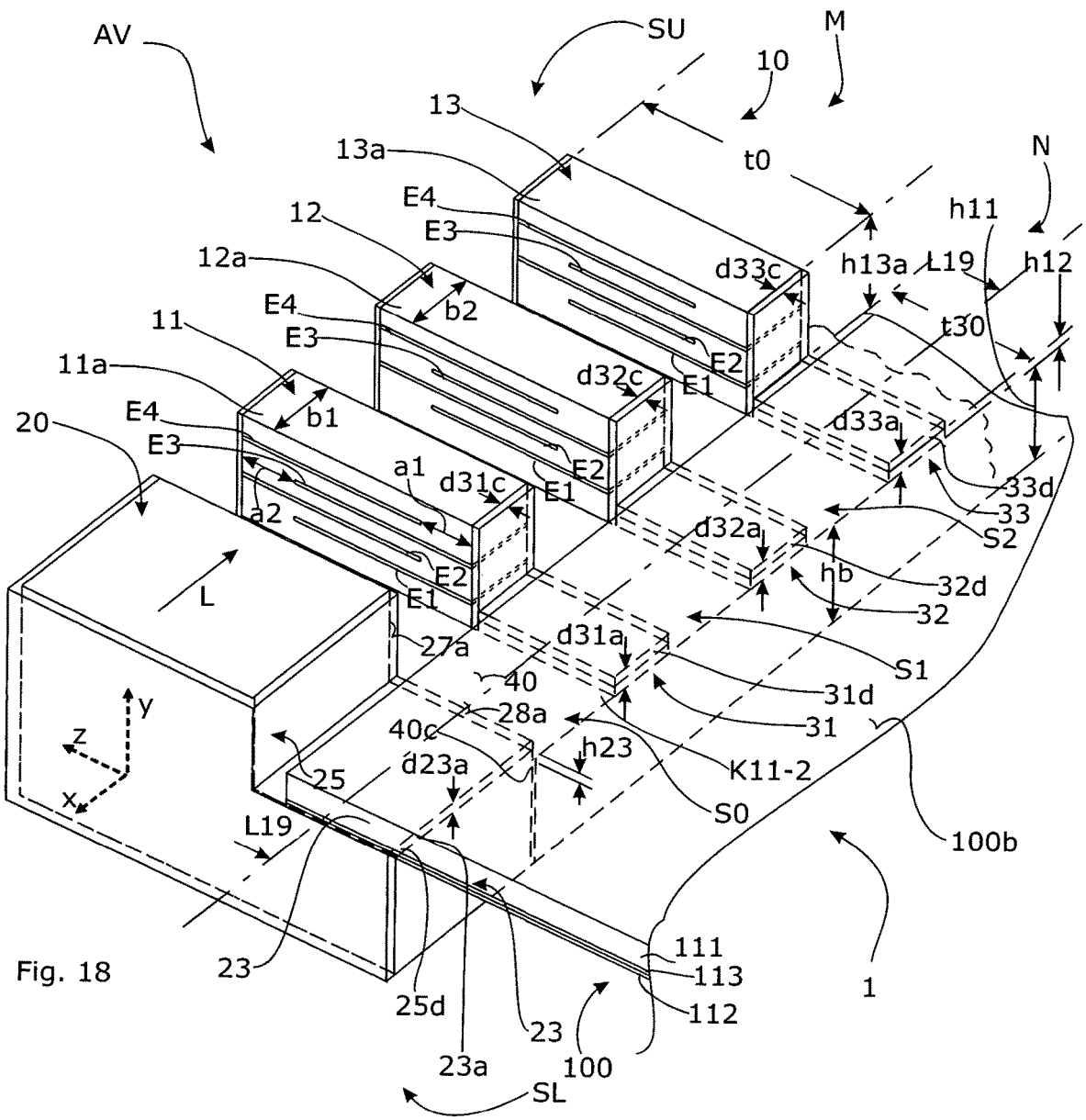
FIG. 18 depicts the actuator device of FIG. 17 in the presentation of the same, wherein at the connection device the printed circuit board is shown.
Figure 19:
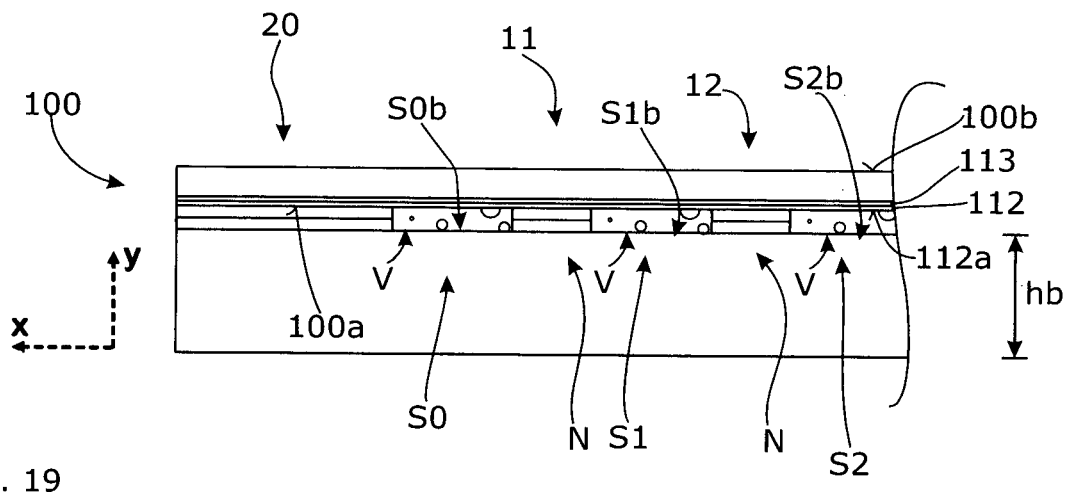
FIG. 19 is a presentation of the cross-section of a part of the actuator device of FIG. 18 along line L19-L19 of the same, wherein in a space which is limited by the main body, the actuator connection coatings and the printed circuit board, a resin reinforcement material is disposed according to the disclosure while connecting the same, wherein the printed circuit board lies directly on the step sections of the actuators.
Figure 20:
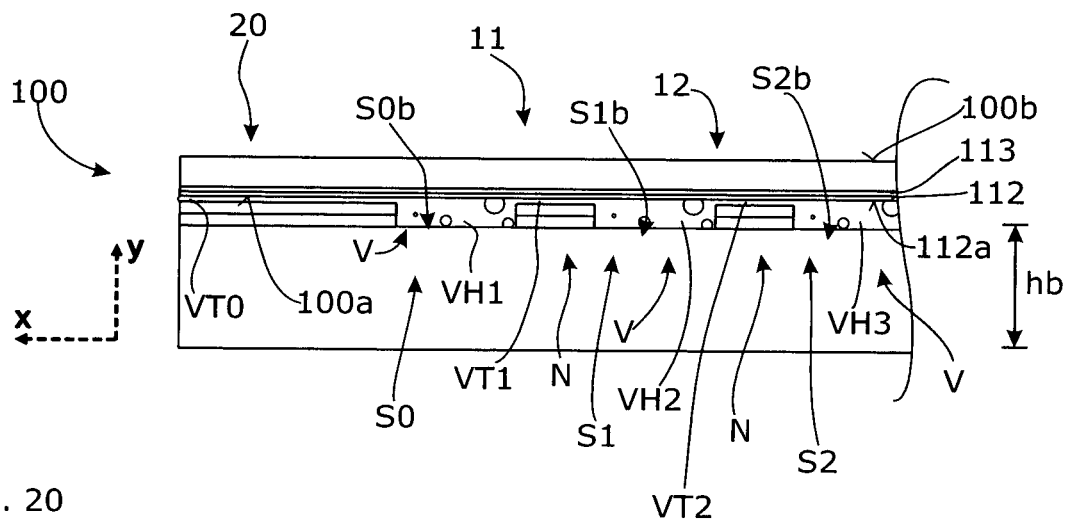
FIG. 20 depicts a presentation of the cross-section of a part of the actuator device of FIG. 18 along line L19-L19 of the same, wherein additionally between the actuator connection coatings and the printed circuit board a resin reinforcement material lies which connects the respective ones with one another.

As shown in FIGS. 16 and 20, provision can be made that the resin reinforcement material is additionally be disposed or lies between the respective actuator connection coating or extension sublayer 31d, 32d, 33d and of the printed circuit board 100 for fixation of the printed circuit board 100 at the respective extension sublayer 31d, 32d, 33d, wherein the part of the reinforcement material which lies therebetween or the connection sublayer VT0 and VT1 and VT2, respectively, is connected with the main part VH1 and VH2 and VH3, respectively, of the reinforcement material which is respectively disposed next to the same in the X-direction, wherein the reinforcement material lies in the connection area segment S1b of the respective recess S1.

The connection partial layers VT1 and VT2, respectively, can be originated during or after placing the printed circuit board 100 on the actuator connection coatings 31d, 32d, 33d, when with a corresponding, in advance determinable amount of resin reinforcement material and by placing the same on the extension sublayer an inflow of the resin reinforcement material additionally between the respective extension sublayers and the printed circuit board occurs in order to fix the printed circuit board to the extension sublayer. In this case, the part of the reinforcement material which lies between the those parts these are joined to the part of the reinforcement material which lies in the connection area segment of the respective recess which delimits the extension sublayer. In this case further an amount of resin reinforcement material is disposed in the connection area segments S0b, S1b, S2b, S3b such that the resin reinforcement material contacts the surfaces which delimit the connection area segments S0b, S1b, S2b, S3b.

In this case that a return body 21 is provided, the connection sublayer VT0 between a return connection coating 23a which is electrically connected with the rear side layer 4 and the printed circuit board 100 can be provided optionally. In this case the actuator connection coatings or extension sublayers 31d, 32d, 33d and the return connection coating 23a can respectively be connected with the electric poles of the electric excitation device which are contrary to each other.

The invention claimed is:

1. An actuator device, comprising:
   a main body with a base body and buildup body which extends from the base body in a thickness direction,
   a plurality of actuators forming the buildup body, wherein each of the actuators extends in a depth direction and is formed of an actuator body which is made of a piezoelectric or electrostrictive material and comprises actuation electrodes which are disposed at or in the actuator and which are distanced from each other, wherein the actuators are arranged behind each other in the longitudinal direction of the actuator device, wherein an actuation area segment of a recess is formed between each of two neighboring actuators,
   wherein the actuators comprise electroconductive actuator connection coatings which are electrically connected to the actuation electrodes of the actuators, wherein the actuator connection coatings, at least in sections, are disposed:
   (i) either on a surface of the base body which is oriented in the thickness direction,
   (ii) or on an actuator step section of the actuators, wherein the actuator step section joins, in a depth direction, a respective actuator body of the actuators,
   wherein between actuator connection coatings of respective two neighboring actuators a respective connection area segment of a respective recess is disposed,
   a printed circuit board which extends in the longitudinal direction of the actuator device over at least sections of the actuator connection coatings, wherein the conductive paths of the printed circuit board are in electrical contact with the actuator connection coatings,
   wherein in the connection area segment of the respective recess, at least in sections, a connection layer is disposed which is made of a resin reinforcement material, wherein the connection layer, at least in sections, contacts side surfaces which delimit the respective connection area segment and which are opposed to each other, the surface section of the base body, which is oriented in the thickness direction, and the area of the printed circuit board which faces the surface section of the base body, in order to support the printed circuit board in the area of the respective connection area segments of the respective recess and to fix the printed circuit board to the actuator connection coatings.

2. An actuator device according to claim 1, wherein the resin reinforcement material comprises bismaleimide.

3. An actuator device according to claim 2, wherein the resin reinforcement material contains bismaleimide with a portion between 5 percent by weight and 90 percent by weight of the reinforcement material.

4. An actuator device according to claim 2, wherein the resin reinforcement material contains bismaleimide with a minimum portion of 20 percent by weight of the reinforcement material.

5. An actuator device according to claim 2, wherein the bismaleimide consists of 1,1'-(methylenedi-p-phenylene)bismaleimide or can be formed of 1,1'-(methylenedi-p-phenylene)bismaleimide.

6. An actuator device according to claim 1, wherein the resin reinforcement material contains an acrylate with a portion between 0.1 percent by weight and 30 percent by weight of the reinforcement material.

7. An actuator device according to claim 1, wherein the resin reinforcement material contains acrylate with a portion between 0.1 percent by weight and 20 percent by weight and bismaleimide with a portion between 1 percent by weight and 80 percent by weight.

8. An actuator device, according to claim 7, wherein the acrylate consists of triethylene-glycol-dimethacrylate or is formed of triethylene-glycol-dimethacrylate.

9. An actuator device according to claim 1, wherein the resin reinforcement material contains a phenolic resin with a portion between 0.1 percent by weight and 40 percent by weight.

10. An actuator device according to claim 1, wherein the resin reinforcement material contains a phenolic resin with a portion of at least 0.1 percent by weight to 40 percent by weight, an acrylate between 0.1 percent by weight and 30 percent by weight and bismaleimide with a portion between 0.1 percent by weight and 30 percent by weight.

11. An actuator device according to claim 9, wherein the phenolic resin consists of 4,4'-(1-methylethylidene)bis[2-(2-propenyl)phenol] or is formed of 4,4'-(1-methylethylidene)bis[2-(2-propenyl)phenol)].

12. An actuator device according to claim 2, wherein the resin reinforcement material with bismaleimide is produced by adding powdery bismaleimide to epoxy resin.

13. Method for manufacturing an actuator device according to claim 1, wherein the method comprises the following steps:
- disposing resin reinforcement material in the respective connection area segment segments, wherein the resin reinforcement material is in a not yet activated state,
- applying the printed circuit board onto the actuator connection coatings, wherein an amount of the resin reinforcement material is disposed in the respective connection area segments such that the resin reinforcement material contacts the surfaces which limit the respective connection area segment, and
- activating the resin reinforcement material by heating to crosslink the resin reinforcement material.

* * * * *